(12) United States Patent
Yuen et al.

(10) Patent No.: US 8,593,224 B1
(45) Date of Patent: Nov. 26, 2013

(54) REGULATOR AND TEMPERATURE COMPENSATION BIAS CIRCUIT FOR LINEARIZED POWER AMPLIFIER

(75) Inventors: Cindy Yuen, Saratoga, CA (US); Duc Chu, San Jose, CA (US); Kirk Laursen, Atlanta, GA (US)

(73) Assignees: EpicCom, Inc., Sunnyvale, CA (US); Epic Communications, Inc., Hsinchu (TW)

( * ) Notice: Subject to any disclaimer, the term of this patent is extended or adjusted under 35 U.S.C. 154(b) by 8 days.

(21) Appl. No.: 13/488,224

(22) Filed: Jun. 4, 2012

Related U.S. Application Data

(62) Division of application No. 12/790,237, filed on May 28, 2010, now Pat. No. 8,228,122.

(60) Provisional application No. 61/217,963, filed on Jun. 5, 2009, provisional application No. 61/281,635, filed on Nov. 20, 2009.

(51) Int. Cl.
*H03F 3/04* (2006.01)

(52) U.S. Cl.
USPC .......................................... 330/289; 330/296

(58) Field of Classification Search
USPC .................................. 330/289, 288, 285, 296
See application file for complete search history.

(56) References Cited

U.S. PATENT DOCUMENTS

| | | | |
|---|---|---|---|
| 6,313,705 B1 * | 11/2001 | Dening et al. | 330/276 |
| 7,109,800 B2 * | 9/2006 | Noh et al. | 330/296 |
| 7,154,336 B2 * | 12/2006 | Maeda | 330/285 |
| 7,355,480 B2 * | 4/2008 | Honda | 330/296 |
| 7,705,658 B2 * | 4/2010 | Yamamoto et al. | 327/478 |

* cited by examiner

*Primary Examiner* — Henry Choe

(57) ABSTRACT

An improved regulator circuit, temperature compensation bias circuit, and amplifier circuit are disclosed.

8 Claims, 24 Drawing Sheets

Q10: E-PHEMT Linearizer and Q9 as Bias HBT), tracks with Q5/Q4 in Novel Regulator in Fig 20

REGULATOR AND TEMPERATURE COMPENSATION BIAS CIRCUIT FOR LINEARIZED POWER AMPLIFIER

REFERENCE TO RELATED APPLICATION

This application is a divisional of U.S. patent application Ser. No. 12/790,237, filed 28 May 2010, which application claims the benefit of U.S. Provisional Application 61/217,963, filed 5 Jun. 2009, and claims the benefit of U.S. Provisional Application 61/281,635 filed 20 Nov. 2009, all of which are incorporated herein by reference.

RELATED APPLICATION

This application is related to U.S. patent application Ser. No. 11/664,749, which is incorporated herein by reference.

BACKGROUND

1. Field of the Invention

This technology relates to linearized power amplifiers (LPAs).

2. Description of Related Art

Prior LPAs have a variety of issues as follows.

1. Prior LPA Efficiency and Linearity Issues:

Prior linearized power amplifiers have several deficiencies including less than optimal efficiency, linearity, and performance over a voltage range and over a temperature range. One of the primary goals of any LPA is to provide a linear signal at as high a power level as possible. In a prior art LPA, the LPA current increases steadily with RF power out. At some high RF power level, clipping begins to occur to the RF signal thereby degrading linearity and efficiency at high RF power. One approach is to delay the onset of clipping, by reducing the bias current at high RF power levels to delay the onset of clipping.

2. Prior LPA Performance Over Voltage Range Issue:

Prior LPAs also tend to have significant variation in performance as power supply voltage level varies.

3. Prior LPA Performance Over Temperature Range Issue:

Another shortcoming of prior LPAs is LPA performance over a temperature range. A prior art LPA with a fixed bias exhibits large changes in current/efficiency and linearity performance as the temperature changes from cold to room to hot.

4. Other Prior LPA Issues:

Some prior art LPAs attempt to improve these deficiencies by utilizing complex digitally modulated PA and digital pre-distortion schemes. However these types of designs are complex to design and implement, and tend to be large and consume much power. They are also usually silicon based technologies with inherently inferior RF characteristics, they cannot take advantage of the inherently superior RF characteristics of GaAs materials. Our novel LPA would be relatively simple and compact and able to be implemented on GaAs as a single die.

SUMMARY

Various embodiments of LPAs described herein demonstrate one or more of the following advantages:

1. Delaying the onset of clipping until the RF power level is as high as possible, to a degree superior than prior LPAs.

2. Low variation in performance as power supply voltage level varies. Stable LPA performance over a wide range of voltage levels, such as for mobile applications that use batteries.

3. Improved temperature compensation and have relatively temperature independent performance.

4. Inherently superior RF characteristics of GaAs materials.

5. Relatively simple and compact and implementable as a single die.

Regulator Circuit

In one aspect of the technology, a regulator circuit maintains a constant output supply voltage despite receiving power from an input supply voltage subject to variation. The circuit comprises an input, a plurality of transistors, and an output. The input receives the supply voltage subject to voltage variation. The plurality of transistors is powered by the supply voltage subject to voltage variation. The plurality of transistors has turn on voltages. A sum of the turn on voltages substantially determines the constant output supply voltage. The output provides the constant output voltage.

In one embodiment, the constant output supply voltage remains constant over a range between 2.8 V and 6 V of the input supply voltage subject to voltage variation.

In one embodiment, the plurality of transistors powered by the input supply voltage subject to voltage variation includes a first transistor and a second transistor.

The first transistor has a control terminal, a first current carrying terminal receiving power from the input supply voltage subject to variation, a second current carrying terminal coupled to a ground, and the turn on voltage between the control terminal and the second current carrying terminal.

The second transistor has a control terminal, a first current carrying terminal coupled to the output and receiving power from the input supply voltage subject to variation, a second current carrying terminal coupled to the control terminal of the first transistor, and the turn on voltage between the control terminal and the second current carrying terminal.

In one embodiment, at least one of the first transistor and the second transistor is a bipolar junction transistor. The control terminal of the bipolar junction transistor is a base terminal, the first current carrying terminal of the bipolar junction transistor is a collector terminal, the second current carrying terminal of the bipolar junction transistor is an emitter terminal, and the turn on voltage of the bipolar junction transistor is between the base terminal and the emitter terminal.

In one embodiment, the first transistor and the second transistor are enhancement mode pseudomorphic high electron mobility transistors. The control terminal of the enhancement mode pseudomorphic high electron mobility transistor is a gate terminal, the first current carrying terminal of the enhancement mode pseudomorphic high electron mobility transistor is a drain terminal, the second current carrying terminal of the enhancement mode pseudomorphic high electron mobility transistor is a source terminal, and the turn on voltage of the enhancement mode pseudomorphic high electron mobility transistor is a positive voltage between the gate terminal and the source terminal.

In one embodiment, the sum of the turn on voltages substantially determining the constant output supply voltage, is a sum of (i) the turn on voltage between the control terminal and the second current carrying terminal of the first transistor, and (ii) the turn on voltage between the control terminal and the second current carrying terminal of the second transistor.

One embodiment further comprises a resistor. The resistor couples the first current carrying terminal of the first transistor and the control terminal of the second transistor. The resistor allows limited adjustment of the constant output supply voltage. The limited adjustment is sufficient to optimize quiescent current of an output RF transistor receiving power from the regulator circuit to optimize performance of a linearized power amplifier including the output RF transistor.

In another embodiment further comprising a resistor, the resistor couples the first current carrying terminal of the first transistor and a node receiving power from the input supply voltage. A voltage drop across the resistor is determined by an excess voltage of the input supply voltage beyond the sum of the turn on voltages.

In yet another embodiment further comprising a resistor, the resistor couples the control terminal of the second transistor to the output. The sum of the turn on voltages and a voltage drop across the resistor determines the constant output supply voltage.

One embodiment further comprises a third transistor. The third transistor is a depletion mode pseudomorphic high electron mobility transistor having a control terminal coupled to the first current carrying terminal of the first transistor and the control terminal of the second transistor, a first current carrying terminal receiving power from the input supply voltage subject to voltage variation, and a second current carrying terminal coupled to the output and to the first current carrying terminal of the second transistor.

In another embodiment further comprising a third transistor, the third transistor is a depletion mode pseudomorphic high electron mobility transistor having a control terminal receiving an on-off control voltage for the regulator circuit, a first current carrying terminal receiving power from the input supply voltage subject to voltage variation, and a second current carrying terminal supplying power to the regulator circuit.

Temperature Compensated Bias Circuit

Another aspect of the technology is a temperature compensated bias circuit of a radio frequency transistor having a control terminal, a first current carrying terminal, and a second current carrying terminal, comprising an output, a first transistor, a second transistor, and a diode.

The output provides a temperature compensated bias to a radio frequency transistor.

The first transistor has a control terminal, a first current carrying terminal receiving power from a first regulated voltage source, and a second current carrying terminal coupled to the output.

The second transistor has a control terminal coupled to the second current carrying terminal of the first transistor and the output, a first current carrying terminal receiving power from a second regulated voltage source, and a second current carrying terminal coupled to a ground.

The diode is at an intermediate position between the second regulated voltage source and the first current carrying terminal of the second transistor. The diode determines current through the first current carrying terminal of the second transistor. The current through the first current carrying terminal of the second transistor determines a first voltage difference between the control terminal of the second transistor and the second current carrying terminal of the second transistor.

In one embodiment, at least one of the first transistor and the second transistor is a bipolar junction transistor. The control terminal of the bipolar junction transistor is a base terminal, the first current carrying terminal of the bipolar junction transistor is a collector terminal, and the second current carrying terminal of the bipolar junction transistor is an emitter terminal.

In one embodiment, at least one of the first transistor and the second transistor is an enhancement mode pseudomorphic high electron mobility transistor. The control terminal of the enhancement mode pseudomorphic high electron mobility transistor is a gate terminal, the first current carrying terminal of the enhancement mode pseudomorphic high electron mobility transistor is a drain terminal, and the second current carrying terminal of the enhancement mode pseudomorphic high electron mobility transistor is a source terminal.

In one embodiment, the first voltage difference determines a second voltage difference between a control terminal of the radio frequency transistor and the second current carrying terminal of the radio frequency transistor.

In one embodiment, responsive to temperature variation, the current through the first current carrying terminal of the second transistor is determined by the diode, but the first voltage difference of the second transistor changes with temperature variation. In one embodiment, the first voltage difference determines a temperature compensated voltage difference between a control terminal of the radio frequency transistor and the second current carrying terminal of the radio frequency transistor.

In one embodiment, the second transistor has a floating voltage of a difference between the first and second current carrying terminals.

In one embodiment, over a range of an output power of the radio frequency transistor, the first transistor has a current through the first current carrying terminal which increases with the output power of the radio frequency transistor. The range of an output power of the radio frequency transistor includes an upper power range over a threshold power and a lower power range under the threshold power. A rate of increase of the current through the first current carrying terminal of the first transistor is less in the upper power range than in the lower power range, thereby at least partly compensating for nonlinearity of the radio frequency transistor in the upper power range.

Amplifier Circuit #1

Another aspect of the technology is an amplifier circuit, comprising a first regulator circuit, a second regulator circuit, a temperature compensated bias circuit, and a linearized power amplifier circuit.

The first regulator circuit maintains a first constant output supply voltage despite receiving power from an input supply voltage subject to variation.

The second regulator circuit maintains a second constant output supply voltage despite receiving power from the input supply voltage subject to variation.

The temperature compensated bias circuit receives power from the first regulator circuit and the second regulator circuit.

The linearized power amplifier circuit receives a temperature compensated bias from the temperature compensated bias circuit. The linearized power amplifier includes an output radio frequency transistor. The linearized power amplifier includes at least one of a heterojunction bipolar transistor and an enhancement mode pseudomorphic high electron mobility transistor, that is biased by the combination of the regulator circuit and the temperature compensated bias circuit.

In one embodiment, a range of an output power of the radio frequency transistor includes an upper power range over a threshold power and a lower power range under the threshold power. At the lower power range, each of the first constant output supply voltage and the second constant output supply voltage provides current at a constant output voltage level. At the upper power range, each of the first constant output supply voltage and the second constant output supply voltage provides a decreased voltage level compared to the constant output voltage level, resulting in lower current used by the radio frequency transistor.

Amplifier Circuit #2

Another aspect of the technology is an amplifier circuit, comprising a regulator circuit, a temperature compensated bias circuit, and a linearized power amplifier circuit.

The regulator circuit maintains a constant output supply voltage despite receiving power from an input supply voltage subject to variation.

The temperature compensated bias circuit receives power from the regulator circuit.

A linearized power amplifier circuit receives a temperature compensated bias from the temperature compensated bias circuit. The linearized power amplifier includes an output radio frequency transistor. The linearized power amplifier includes at least one of a heterojunction bipolar transistor and an enhancement mode pseudomorphic high electron mobility transistor, that is biased by the combination of the regulator circuit and the temperature compensated bias circuit.

In one embodiment, a range of an output power of the radio frequency transistor includes an upper power range over a threshold power and a lower power range under the threshold power. At the lower power range, the constant output supply voltage provides current at a constant output voltage level. At the upper power range, the constant output supply voltage provides a decreased voltage level compared to the constant output voltage level, resulting in lower current used by the radio frequency transistor.

DETAILED DESCRIPTION

Through this paper, Vcc refers to the supply voltage of the output RF transistor of the linearized power amplifier, and Icc refers to current through the output RF transistor of the linearized power amplifier, in the case of a single stage of the amplifier. In a multi-stage amplifier, Vcc refers to the supply voltage of all of the RF transistors, and Icc refers to the total current through all of the RF transistors. Vcc is also the supply voltage for the regulator circuit, although a different supply voltage may be used.

A power amplifier is a device that increases the power of an input signal by some ratio. The ratio of output power to input power is known as gain. Amplifiers amplify a signal within a certain frequency range, and the range of frequencies for which the amplifier provides useful gain ("useful gain" depending on the application) is known as the bandwidth. In addition to gain and output Power, other figures of merit for amplifiers include linearity and efficiency (among others). Linearity is a figure of merit that indicates how much output power an amplifier can provide, before the output signal becomes distorted. The amount of distortion that can be tolerated depends on the specific application of the amplifier. Efficiency indicates how much power the amplifier needs in order to operate.

An RF or microwave amplifier must include one or more active devices (typically some kind of transistor, of which there are many different types). A useful amplifier will also usually include some kind of bias circuitry to provide the appropriate DC voltages and/or current to the active device(s). Amplifiers also usually include some kind of matching network that will improve the performance of the active device(s) within a certain frequency band. Some amplifiers (known as linearized power amplifiers or LPAs) also include circuitry that improves the linearity of the amplifier.

An LPA has 3 key characteristics:

1. Output Power: LPA Pout determines how far distance the signal can transmit.

2. Linearity: LPA Linearity determines how much data the signal can carry and transmit with high fidelity (without data distortion).

3. Efficiency: LPA Efficiency determines how much power consumption it needs to operate. High LPA efficiency is critical to extend battery life for mobile devices.

Figure 1:
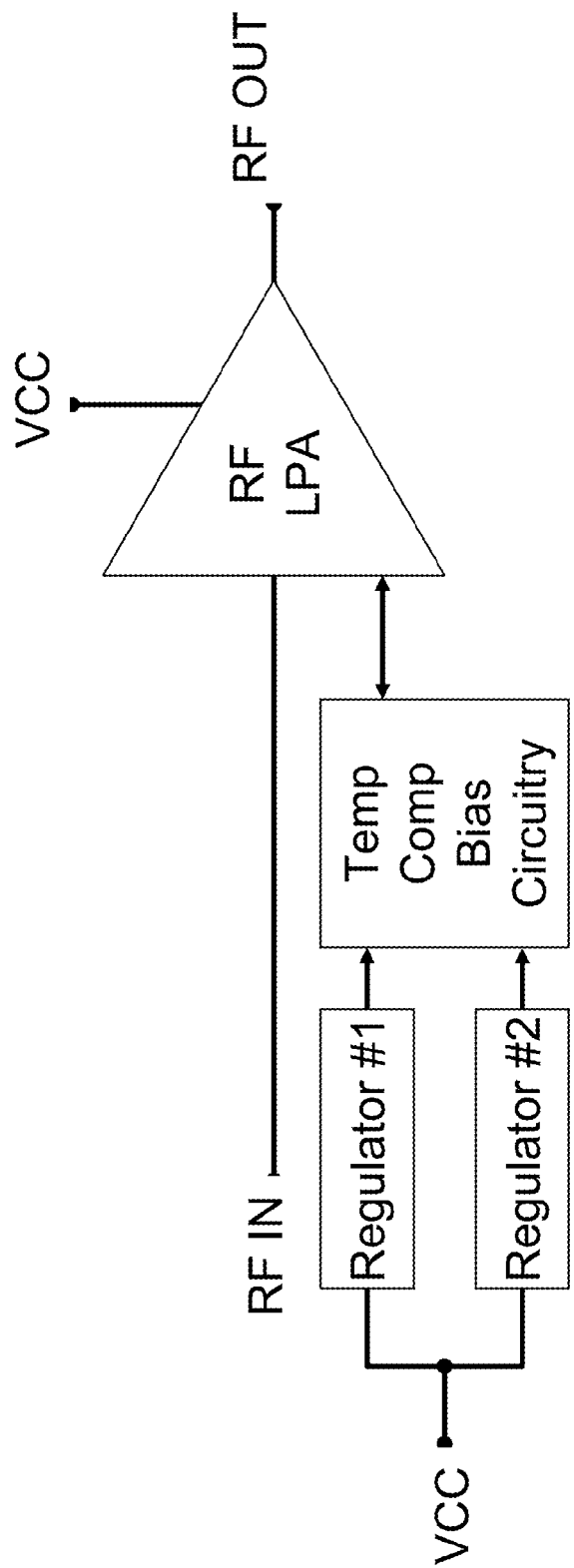
FIG. 1 shows a block diagram of an LPA where the RF stages are biased by temperature compensated bias circuitry that is in turn supplied by two voltage regulators in order to improve performance as Vcc and temperature vary.

FIG. 1 shows a block diagram of an LPA where the RF stages are biased by temperature compensated bias circuitry that is in turn supplied by two voltage regulators in order to improve performance as Vcc and temperature vary. In FIG. 1 the temp comp bias circuitry is biased by two regulators. Regulator #1 is considered to be the linearizer bias (which supplies the collector of Q10 in subsequent figures), and regulator #2 is the reference voltage (Vref). In a multistage PA each RF stage would have its own temp comp bias circuitry, but all of the bias circuits would share/be supplied by the same two regulators. One possible variation would be to use a single regulator for both the linearizer bias and for the Vref.

Figure 2:
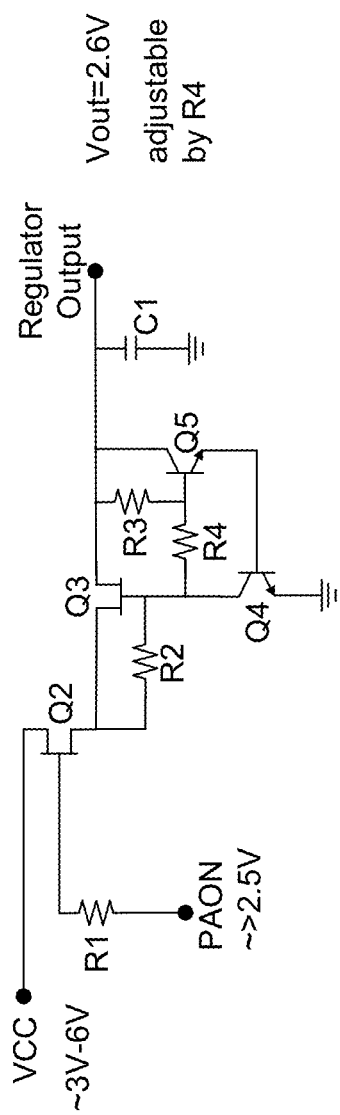
FIG. 2 shows a schematic of the novel regulator circuit with inputs (Vcc and PAON) and output (Vout).

FIG. 2 shows a schematic of the novel regulator circuit with inputs (Vcc and PAON) and output (Vout). FIG. 2 shows a schematic of the novel regulator circuit. In this schematic the value of resistor R4 can be used to adjust the regulator output voltage. A higher R4 resistance path decreases current flow, which makes Vbe drop slightly, hence lower regulator output and lower RF transistor current. This particular schematic shows that Q4 and Q5 are both HBTs and the output voltage is 2.6V (=2×HBT turn-on voltage=2×1.3V). A variation of the regulator could use a E-PHEMT for Q5 if a E-PHEMT was used as transistor Q10 in the linearizer circuit, and the regulator output voltage would be 1.7V (=HBT turn-on voltage+E-PHEMT turn-on voltage=1.3+0.4). Both of these variations assume that an HBT is used as the RF transistor.

An additional variation could use E-PHEMTs for both Q4 and Q5. This would result in an output voltage of 0.8V (=2× E-PHEMT turn-on voltage=2×0.4V). This type of regulator would be useful if the RF transistors in the amplifiers were E-PHEMTs instead of HBT's.

R3 establishes the regulator output voltage.

Figure 3:
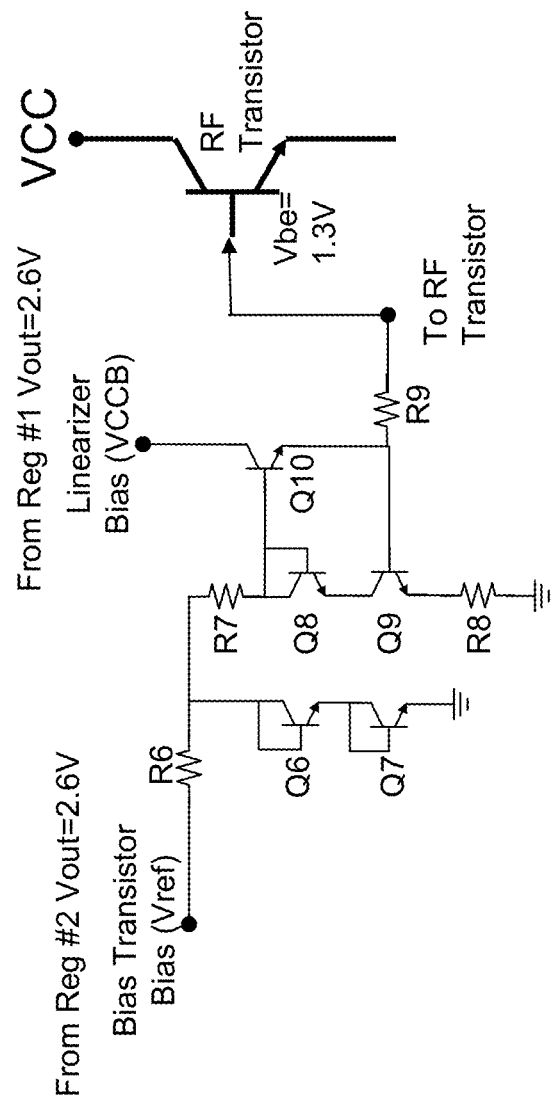
FIG. 3 shows a schematic of the dynamic temp comp bias circuit (including the linearizer).

FIG. 3 shows a schematic of the dynamic temp comp bias circuit (including the linearizer).

In this schematic:
Q10 is the linearizer transistor (gm decreases, hence impedance increases as RF increases)
Q9 is the bias transistor
Q8 provides temperature compensation.
Diode Q8 acts as RF detector. It senses RF power and makes sure that the RF transistor is never underbiased.
Q8 forces current into Q9 thus turning Q9 on.
Vice of Q9 is floating (meaning that the RF transistor is always turned on fully)
Q9 Vbe varies with temperature. Q8 diode forces Q9 to turn on, hence turning on RF transistor. As temperature varies, Q9 current and Q9 Vbe vary to adjust RF transistor Vbe over temp.
R9 also helps to adjust the proper voltage for RF transistor Vbe.
Q10 along with R9 will generate proper gain expansion to compensate gain compression of PA at high RF power.
Note that the circuit will also operate without Q8 (temp comp diode). In another variation of this circuit, Q10 could be a E-PHEMT instead of an HBT (see FIG. 22).

Figure 4:
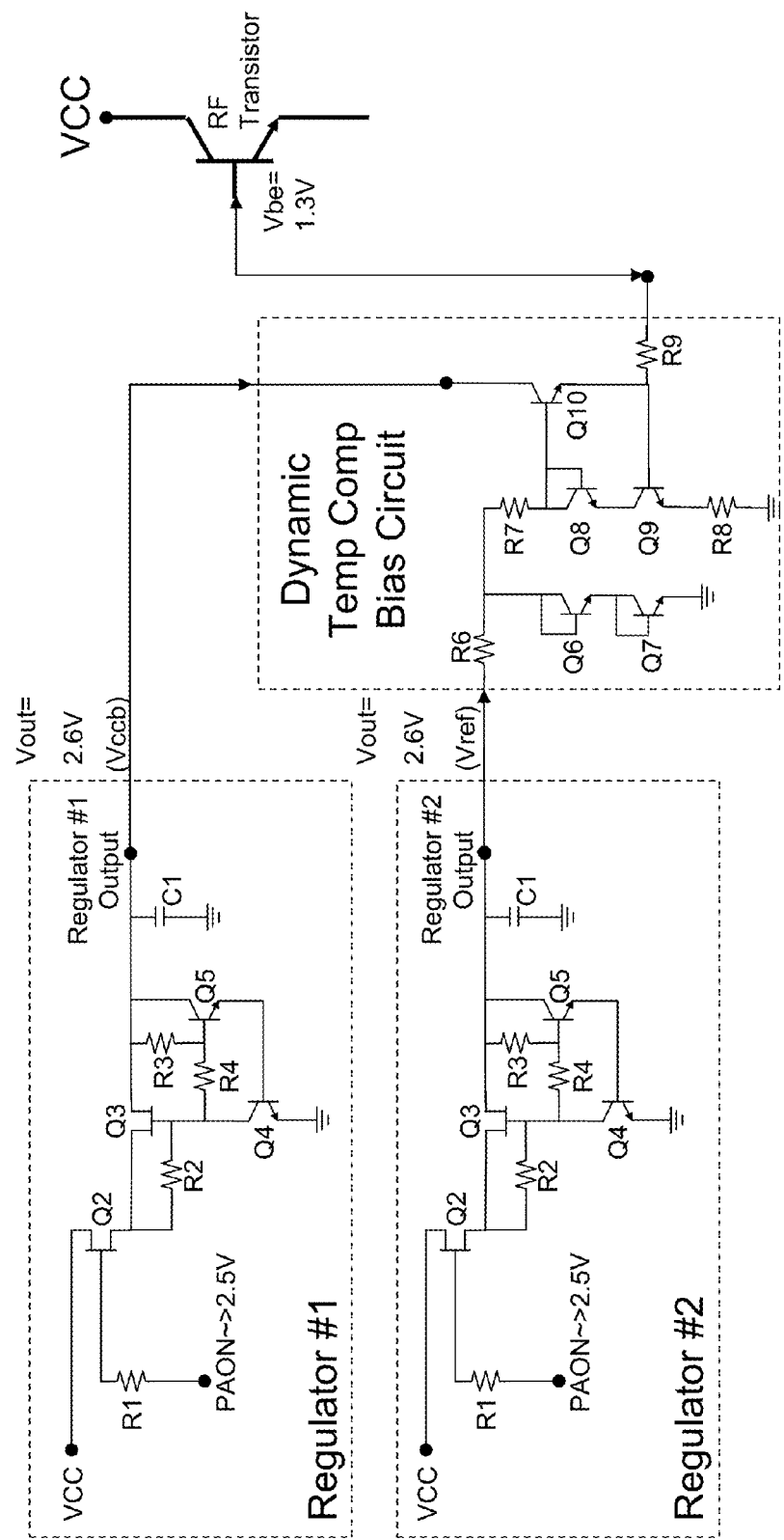
FIG. 4 shows an overall schematic of 2 novel regulators, a dynamic temp-comp bias circuit, and an RF transistor.

FIG. 4 shows an overall schematic of 2 novel regulators, a dynamic temp-comp bias circuit, and an RF transistor.

FIG. 4 shows a detailed schematic for the block diagram in FIG. 1, by combining the circuits shown in FIG. 2 and FIG. 3. The variations described in those figures also apply to FIG. 4. Q5 (in regulators #1 and #2) should be the same type of transistor as Q10—either HBT or E-PHEMT. Q4 (in regulators #1 and #2), Q9, and the RF transistor should also all be the same type of transistor—either HBT or E-PHEMT. The regulator output voltages and the bias circuit output voltage will vary with the type of transistors used. An additional variation could use a single regulator for both Vccb and Vref.

From FIG. 2, the regulator output voltages may be:
2.6V (if Q4, Q5, Q9, Q10, and RF transistor are all HBTs). Vbe will be 1.3V.
1.7V (if Q5 and Q10 are E-PHEMTs, and Q4, Q9, and the RF transistor are HBTs). Vbe will be 1.3V.
0.8V (if Q4, Q5, Q9, Q10, and RF transistor are all E-PHEMTs). Vbe [actually Vgs for E-PHEMT] will be 0.4V.

Figure 5:
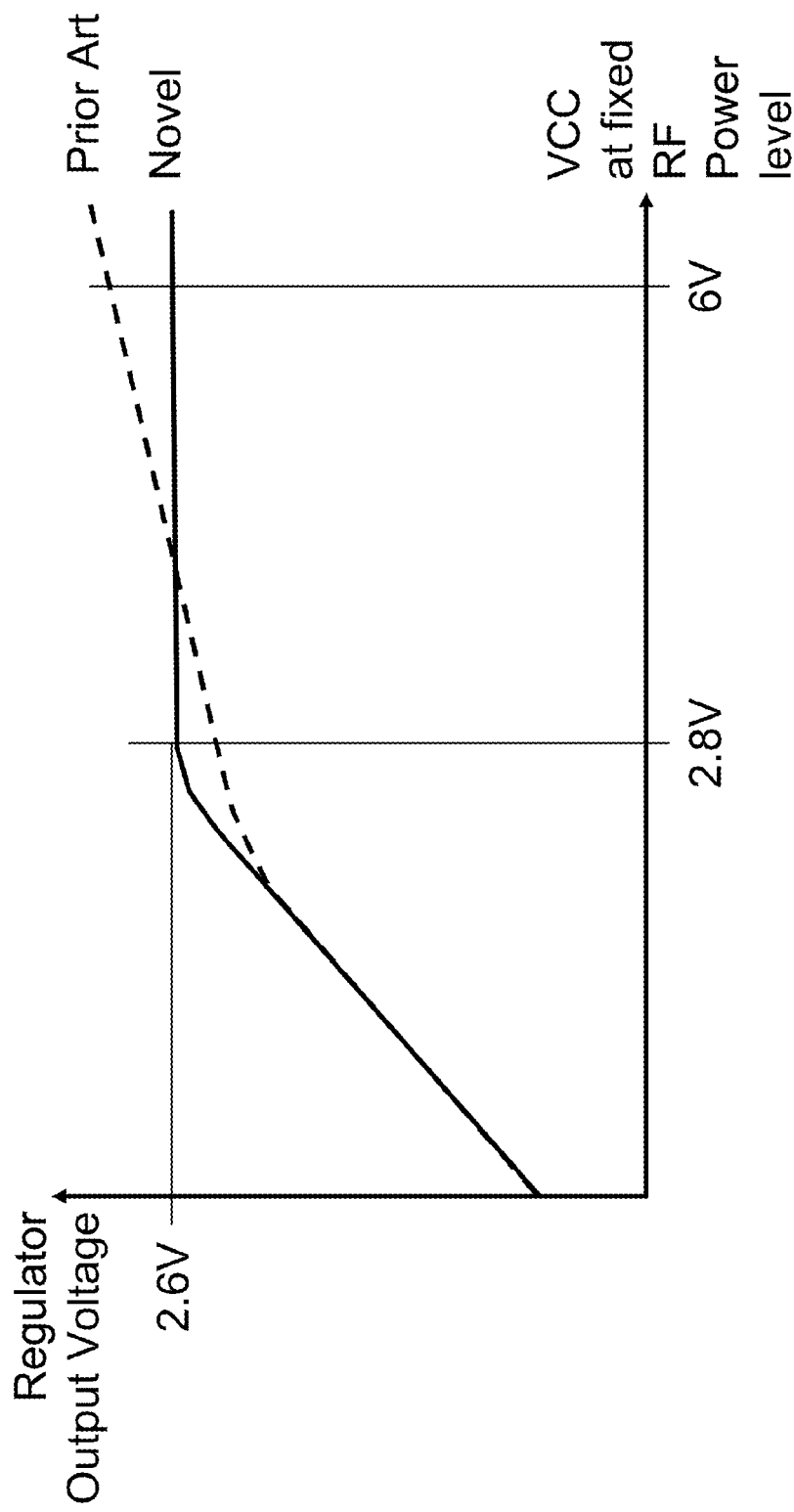
FIG. 5 shows output voltage of the novel regulator compared to a prior art regulator at a fixed RF power level.

FIG. 5 shows output voltage of the novel regulator compared to a prior art regulator at a fixed RF power level.

FIG. 5 shows that the output voltage of the novel regulator has a flatter output voltage level as Vcc varies compared to prior art regulators. A prior art regulator (consisting of a diode pair for example) increases slightly as Vcc increases, while the novel regulator output voltage remains essentially flat as Vcc changes. This will provide a more stable reference and supply voltage level for the dynamic bias circuit, thus improving overall LPA performance as Vcc varies.

Figure 6:
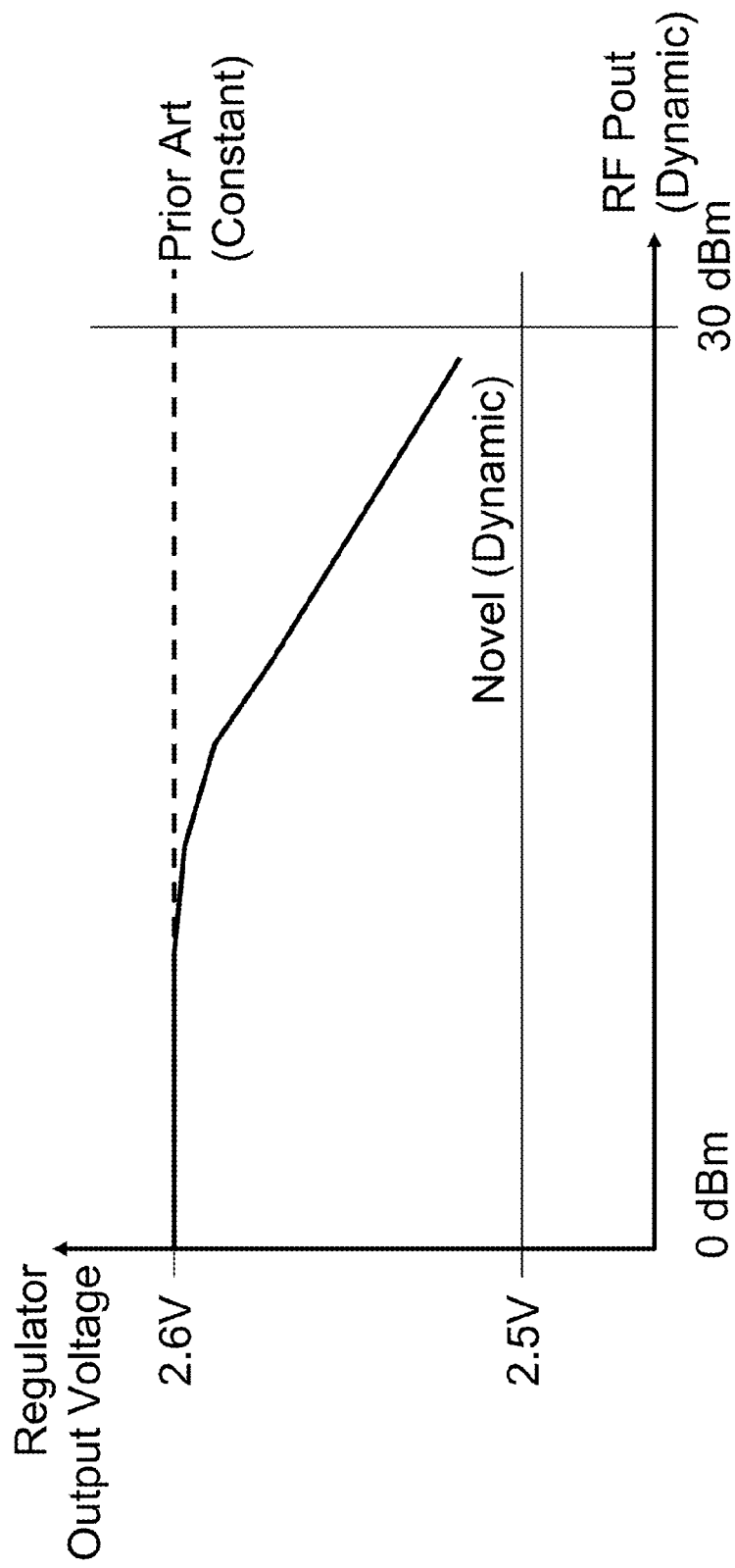
FIG. 6 shows the output voltage of the novel regulator compared to a prior art regulator as the RF power level of the LPA changes.

FIG. 6 shows the output voltage of the novel regulator compared to a prior art regulator as the RF power level of the LPA changes.

FIG. 6 shows that prior art regulator is insensitive to the RF power level and remains constant, while the output voltage of the novel regulator is designed to decrease slightly at high RF power levels. This RF-power dependent dynamic output voltage level of the novel regulator improves the LPA efficiency and linearity (described in more detail in subsequent figures).

Figure 7:
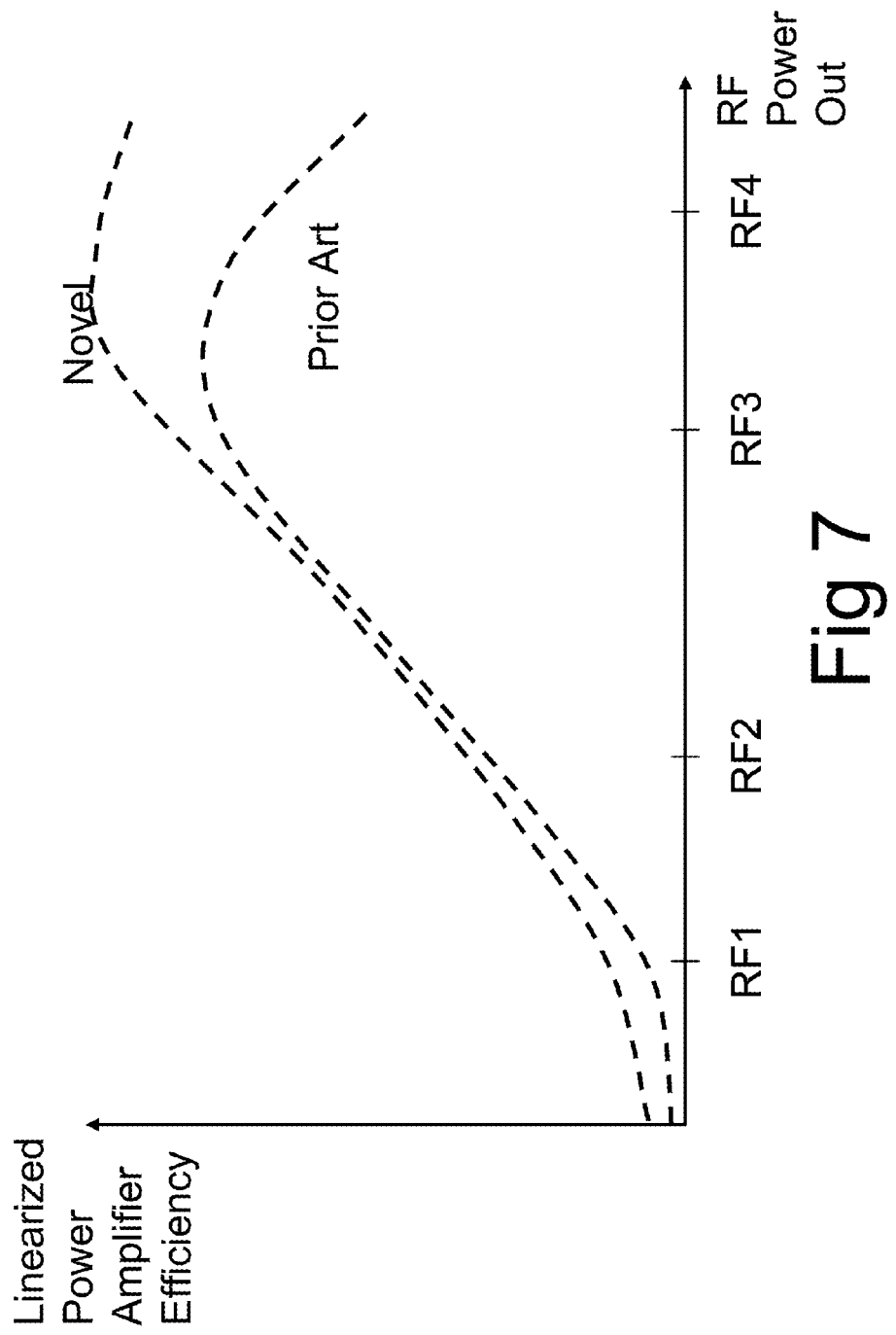
FIG. 7 shows plots of efficiency vs. RF output power of an LPA, and how the novel design improves efficiency compared to prior art.

FIG. 7 shows plots of efficiency vs. RF output power of an LPA, and shows how the novel design improves efficiency compared to prior art.

The efficiency plotted on FIG. 7 is determined as follows:

Efficiency=RF Output Power divided by DC power consumption (DC power consumption=$Vcc \times Icc$)

An alternative efficiency, not plotted on FIG. 7, is determined as follows, and result in almost the same efficiency value for an amplifier with a reasonably high amount of gain:

Power Added Efficiency (or PAE)=RF Output Power minus RF Input Power, then divided by DC power consumption.

PAE is lower than Efficiency.

FIG. 7 plots the LPA efficiency vs. RF power for the novel design and for the prior art. The novel design has slightly better efficiency at low and mid RF power levels (power levels RF1, RF2, and RF3) and significantly better efficiency at high power levels (RF4). This efficiency improvement is due to the dynamic response of the novel regulator. Above the threshold represented by RF3 on the x-axis, the regulator output voltage level starts to decrease slightly as RF power increases. By slightly reducing the regulator output voltage at high RF power levels, the current consumed by the RF transistors is reduced and the LPA efficiency is improved compared to prior art.

Figure 8:
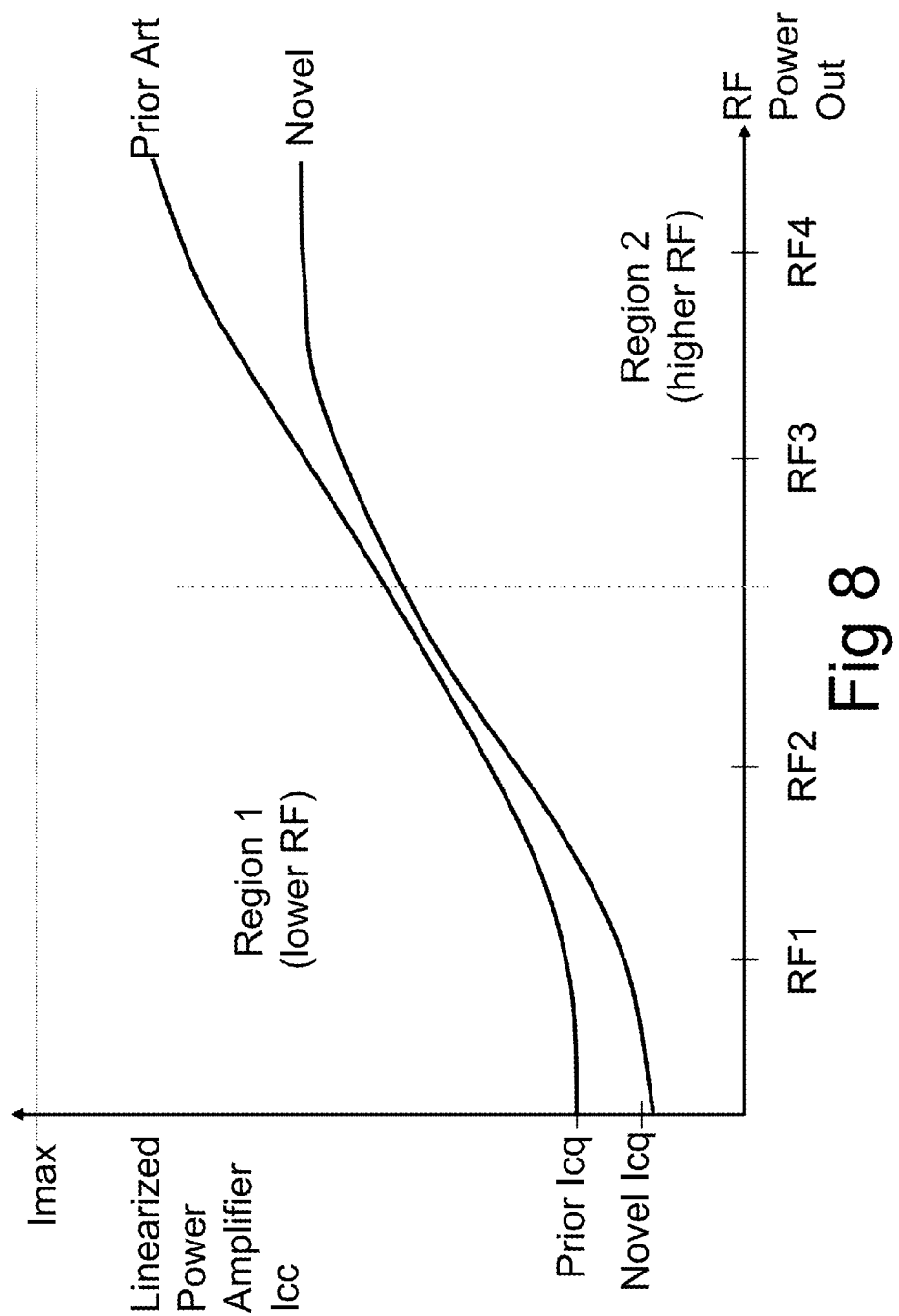
FIG. 8 shows plots the Icc (current) vs. RF output power of an LPA, and shows how the novel design reduces the current consumed compared to prior art.

FIG. 8 plots the Icc (current through RF transistor) vs. RF output power of an LPA, and how the novel design reduces the current consumed compared to prior art.

FIG. 8 plots the Icc vs. RF power for the novel design and for the prior art. The novel design has slightly lower current at low and mid RF power levels (power levels RF1, RF2, and RF3) and significantly lower current at high power levels (RF4). This reduced current at high RF power levels is due to the dynamic response of the novel regulator. Above the threshold represented by RF3 on the x-axis, the regulator output voltage level starts to decrease slightly as RF power increases. By slightly reducing the regulator output voltage at high RF power levels, the current consumed by the RF transistors is reduced compared to prior art.

The decreased rate of increase of the current through the Q10 compensates for the normal nonlinearity of the radio frequency transistor and results in better overall linearity of the radio frequency transistor compared to using a fixed bias supply.

Figure 9:
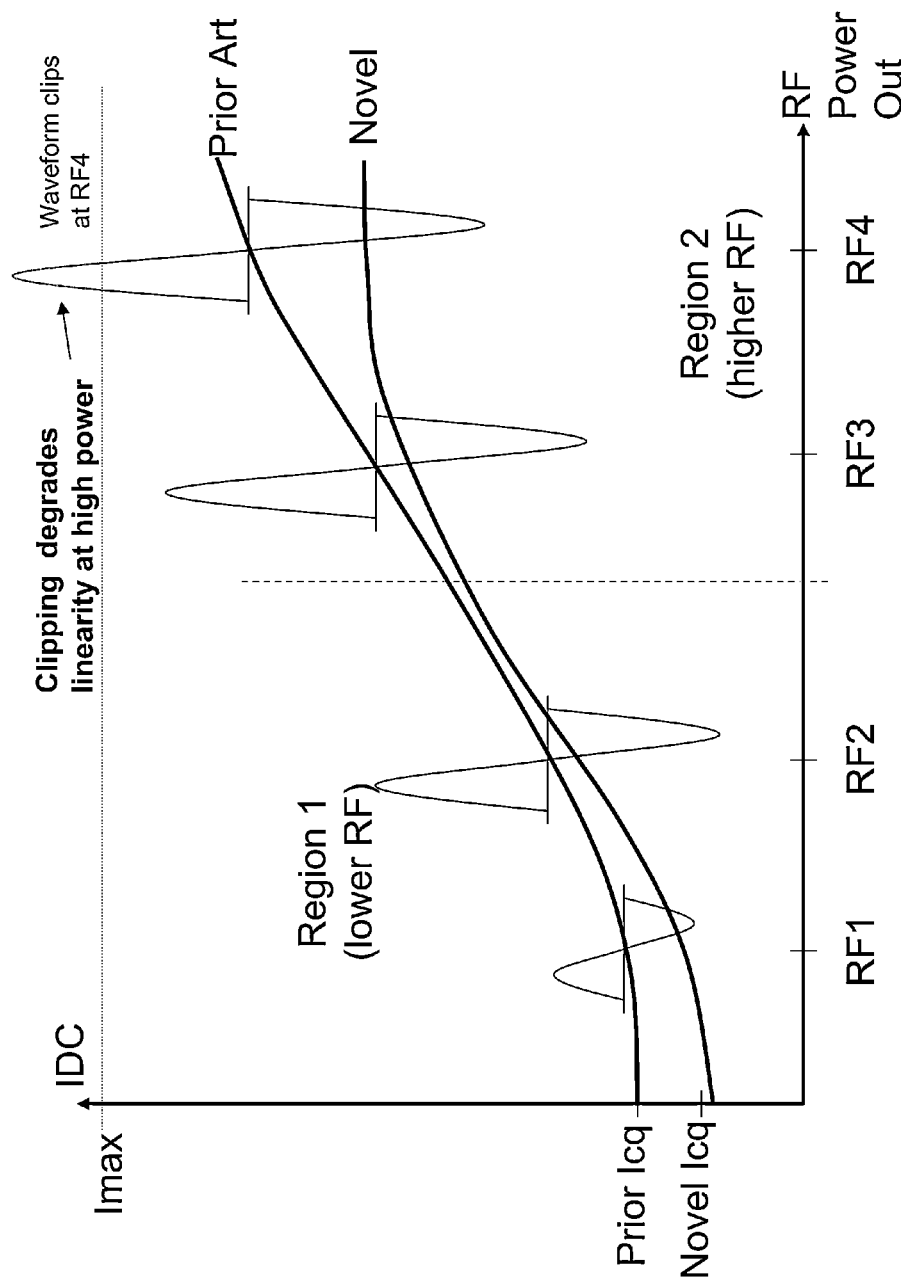
FIG. 9 plots the current (with waveforms) vs. RF power level of a prior art design FIG. 10 plots the current (with waveforms) vs. RF power level of the novel design

As RF power increases and the RF transistor current increases, the currents in the linearizer transistor (Q10) and in the bias transistor (Q9) need to increase to support the RF transistor current increase. Both regulators with constant output voltage (Vout~2.6V) can support the increased current demands of Q10, Q9 and the RF transistor, until the RF power reaches a very high level. Once the RF power increases to a very high level, the regulator can no longer supply the increased current needed by Q10, Q9 and the RF transistor. At very high RF power levels the regulator output voltage will decrease slightly, thus slowing [decreasing] the rate of increase in the current of linearizer transistor Q10 and bias transistor Q9, and consequently slowing the rate of increase in current of the RF transistor (i.e., regulate the RF transistor current so that it will not keep increasing quickly at very high RF power). This results in higher efficiency (due to the described RF transistor current regulation effect) and higher linearity (due to prevention of nonlinearity caused by clipping of the RF current waveform) for LPA performance at very high RF power. FIG. 9 plots the current through RF transistor (with RF waveforms) vs. RF power level of a prior art design The RF waveform amplitude increases as RF power increases.

FIG. 9 is identical to FIG. 8, but with waveforms added to the prior art Icc curve. By looking at the waveforms it is clear that at power level RF4 the waveform is clipped at the Imax level (Imax depends on RF transistor size). This clipping results in degraded linearity at high power levels, which is undesirable for an LPA.

Figure 10:
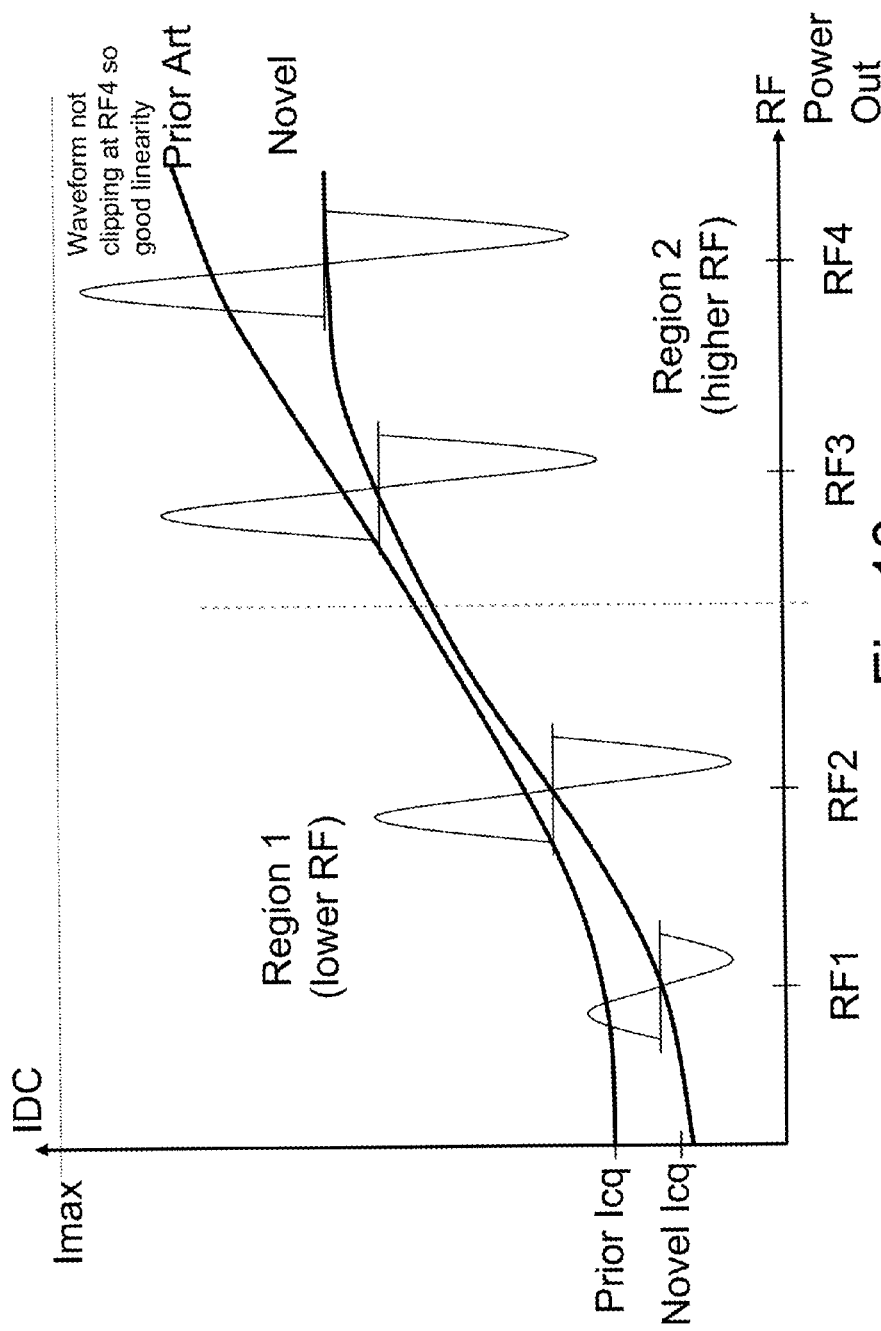

FIG. 10 plots the current through RF transistor (with RF waveforms) vs. RF power level of the novel design The RF waveform amplitude increases as RF power increases.

FIG. 10 is identical to FIG. 8, but with waveforms added to the novel design Icc curve. By looking at the waveforms it is clear that at power level RF4 the waveform is not clipped as it was in the case of the prior art. Because the dynamic response of the novel regulator reduces the current compared to prior art, waveforms are not clipped as quickly and the LPA linearity when using the novel design is improved compared to LPA linearity when using prior art.

Figure 11:
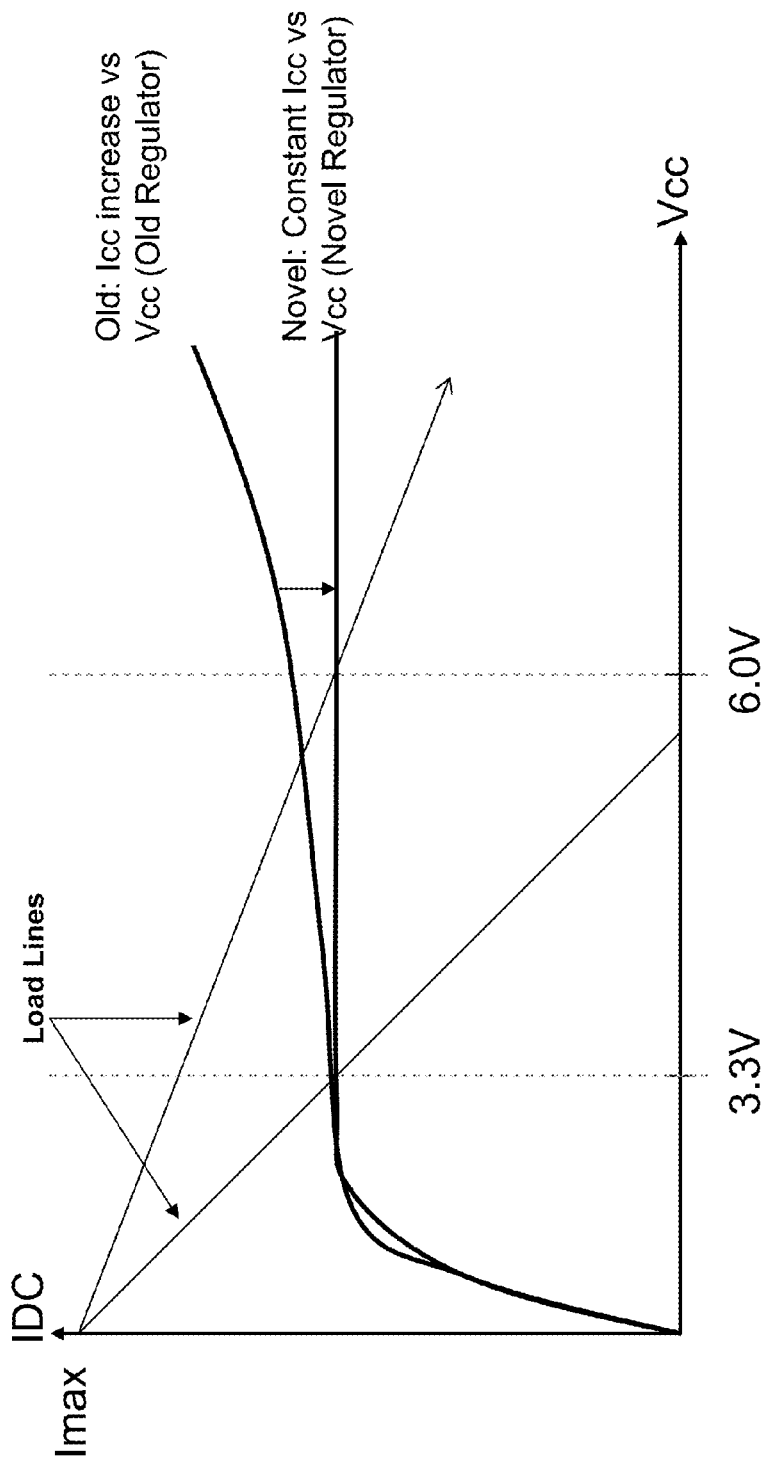
FIG. 11 shows the IV curve with load lines of the prior art and novel regulators.

FIG. 11 shows the IV curve of I and V of the RF transistor, with load lines of the prior art and novel regulators.

FIG. 11 is similar to FIG. 5. Using a prior art regulator the current gradually increases as Vcc increases, while the current remains flat for the novel regulator. The optimized load line impedance (impedance presented to the RF transistor output to achieve maximum LPA RF power) will be higher at high Vcc level (6.0V) than at low Vcc level (3.3V). The current is lower at high Vcc when using the novel regulator. This translates to improved performance for the novel design compared to the prior art, at high Vcc level (6.0V), due to fewer thermal issues (i.e. will not get as hot) compared to prior art designs.

Figure 12:
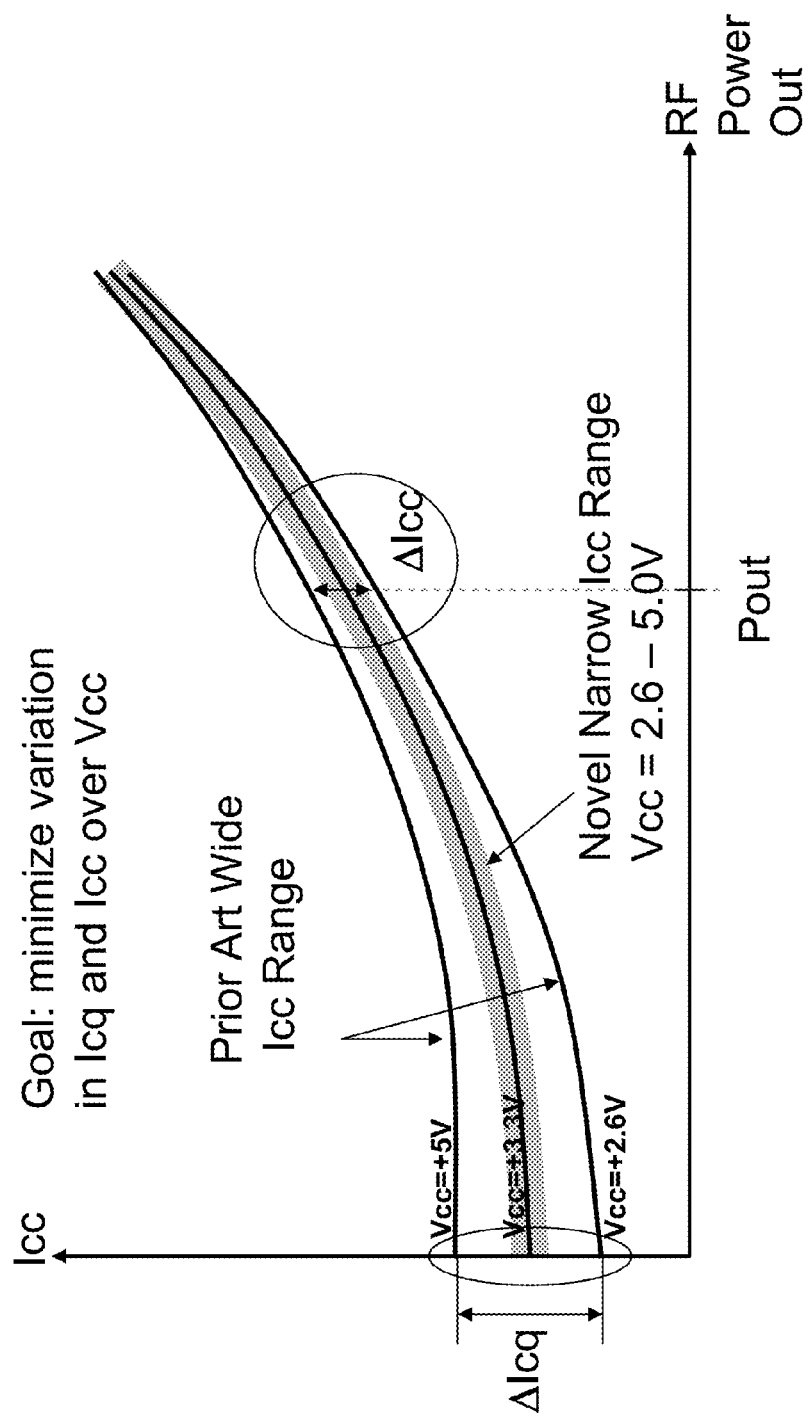
FIG. 12 shows the variation in Icq and Icc vs RF power for the novel and prior art designs

FIG. 12 shows the variation in Icq and Icc through the RF transistor vs RF power for the novel and prior art designs In an LPA, it is desirable to minimize the variation in Icc and Icq (RF Output Power=0) as Vcc changes. In FIG. 12, the top and bottom black lines represent the current levels vs. RF power at different Vcc levels for prior art designs. At no/low RF power levels, the variation in quiescent current (delta Icq) is large as Vcc varies from 2.6V to 5V. As the RF output power increases, the variation in current as Vcc varies is reduced, but still significant. In contrast, the grey zone represents the current variation of the novel design as Vcc varies and across RF power levels. It is clear that the novel design provides much less current variation over the entire RF power range and over the range of Vcc. This is particularly obvious at the quiescent current, where the prior art has a large delta Icq and the novel design has a much smaller delta Icq.

Figure 13:
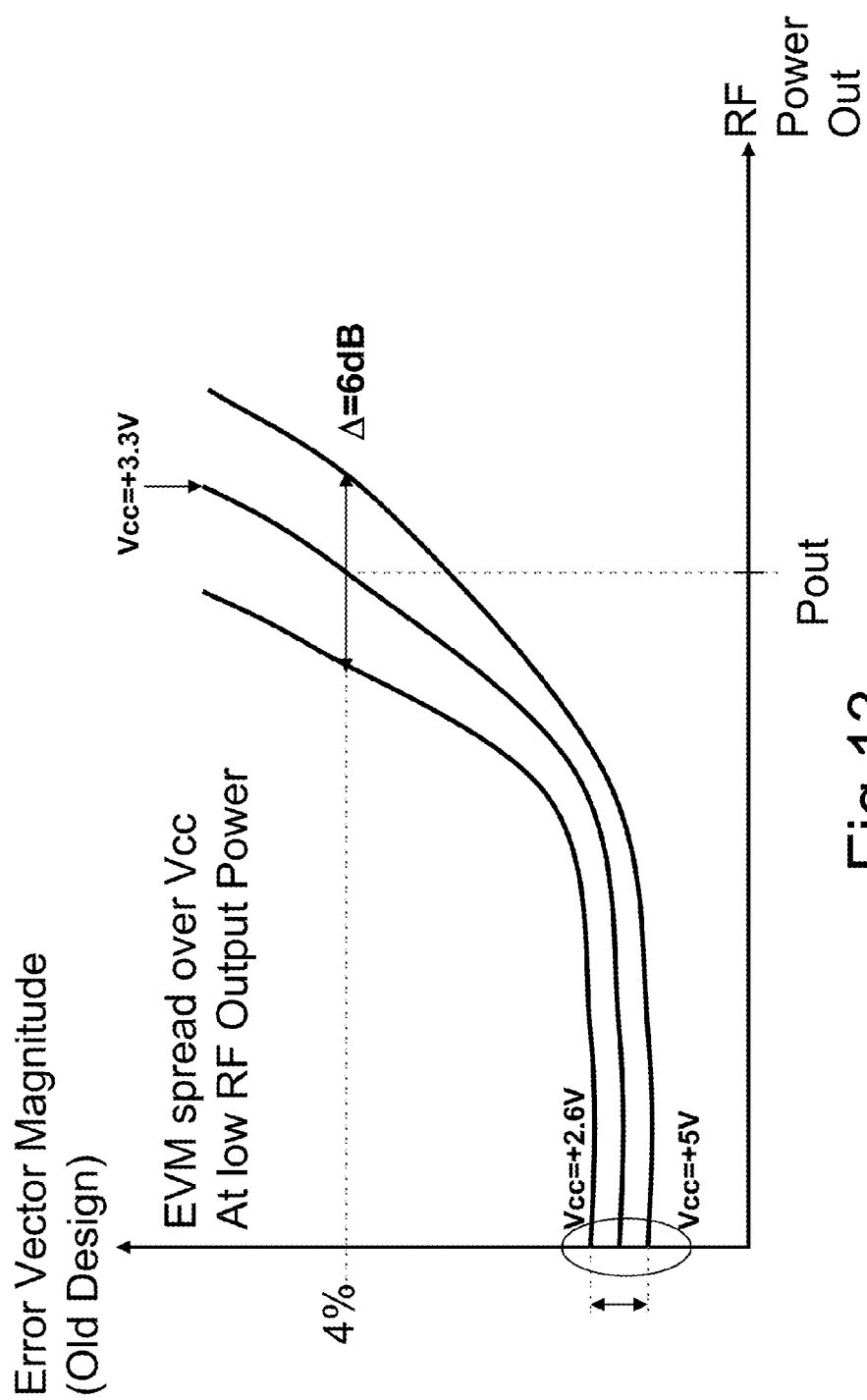
FIG. 13 shows the variation in EVM vs RF power for a prior art design

FIG. 13 shows the variation in EVM vs RF power for a prior art design

In an LPA, it is desirable to minimize the variation in EVM [Error Vector Magnitude, a measure of linearity. High EVM translates to worse LPA linearity.] as Vcc changes. In FIG. 13, the three curves plot EVM vs. RF power level at different values of Vcc for a prior art design. The upper curve (Vcc=2.6V) has the highest EVM at a given RF power level, while the lower curve (Vcc=5V) has the lower EVM at a given RF power level. As the plot shows, the RF power level where EVM is 4% can vary by 6 dB as Vcc changes from 2.6V to 5V. It is desirable to minimize the EVM variation over Vcc, at low RF power level as much as possible. At 4% EVM, it is desirable to minimize the RF output power variation over Vcc, to be close to the physics limit of the amplifier. The amplifier will have higher RF power at higher Vcc, based on device physics.

Figure 14:
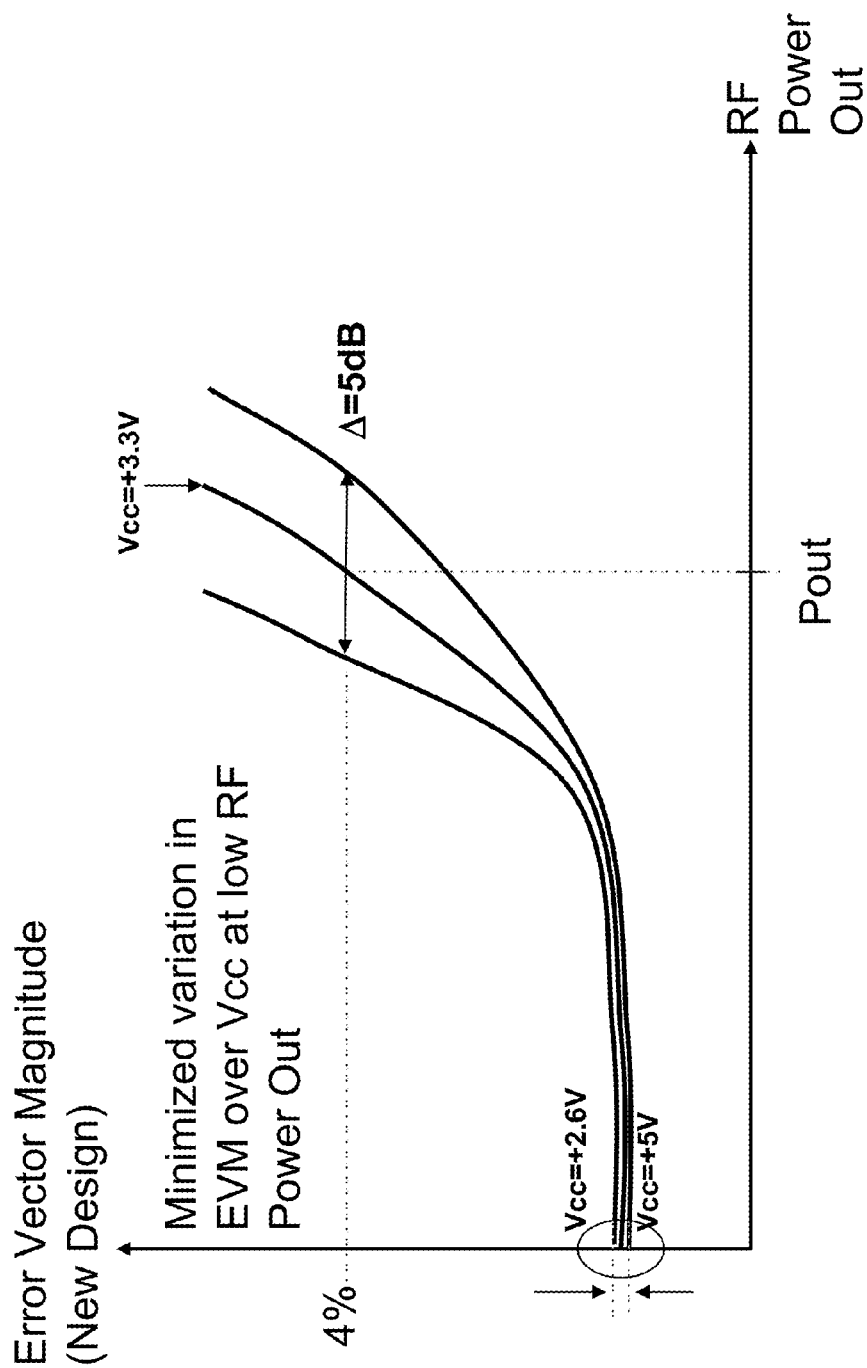
FIG. 14 shows the variation in EVM vs RF power for the novel design

FIG. 14 shows the variation in EVM vs RF power for the novel design

These EVM plots can be simulation or test data. The main differences between FIG. 13 vs FIG. 14 are:

(1) At no RF power: Delta EVM is much lower, or bunched together, in FIG. 14, compared to in FIG. 13, as shown by the vertical arrows. i.e., less EVM spread over Vcc at low RF power.

(2) At 4% EVM linearity level: Delta Pout is lower in FIG. 14, compared to in FIG. 13, as shown by horizontal arrows. FIG. 14 shows the 4% EVM Pout spread over Vcc, but is close to the physical limit of the amplifier. FIG. 13 shows far more spread.

FIG. 14 contrasts the EVM variation of the novel PA to the EVM variation of a prior art PA that was shown in FIG. 13. FIG. 14 shows that the EVM variation at low RF power levels is quite small, even as Vcc varies from 2.6V to 5V. Similarly, the RF power level where EVM is 4% can vary by 5 dB as Vcc changes from 2.6V to 5V (instead of 6 dB variation with the prior art design). Thus the novel design offers improvement in the EVM variation vs Vcc across RF power level. Although there will always be some amount of variation due to the physics of the amplifier. The amplifier will have higher RF power at higher Vcc, based on device physics.

Figure 15:
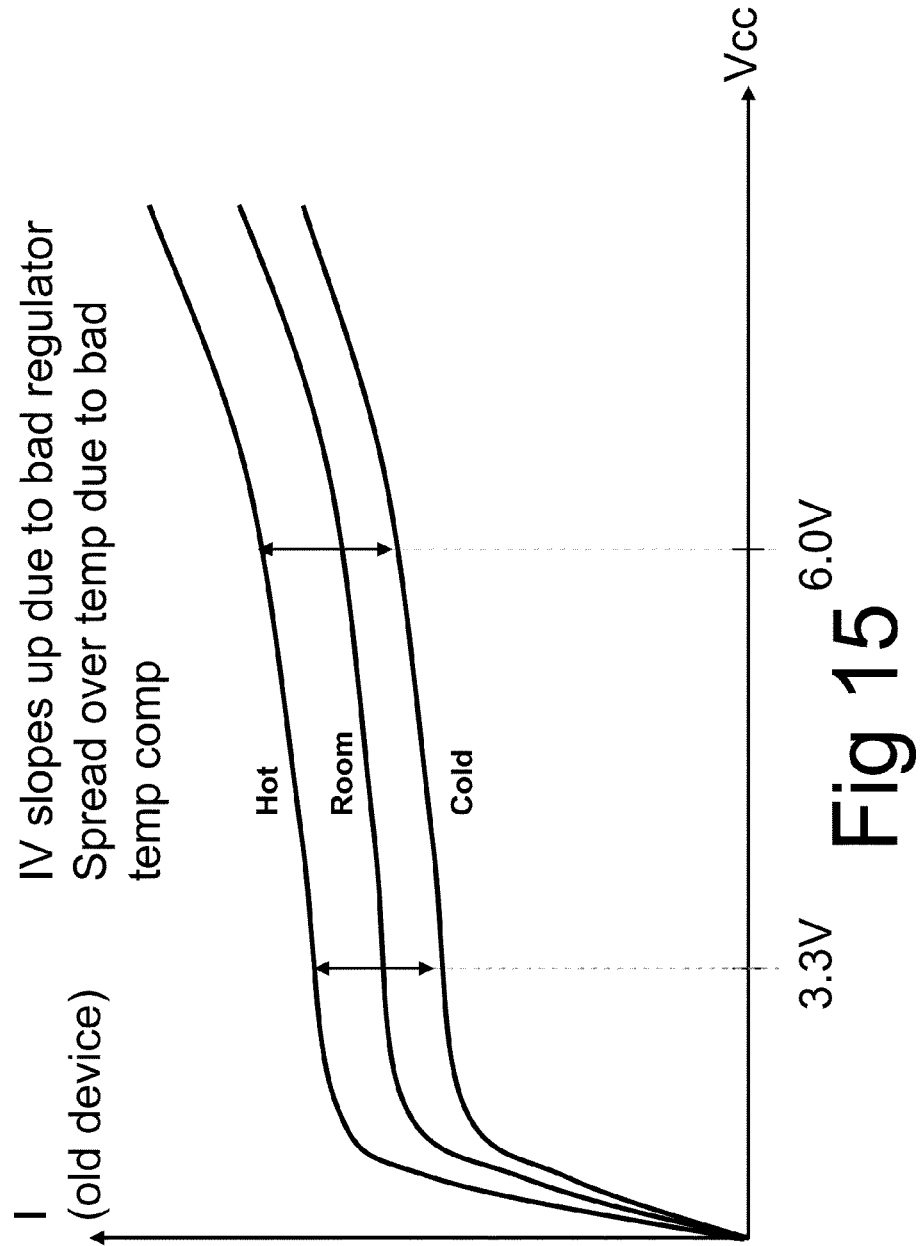
FIG. 15 shows the IV curve of a prior art design over temperature

FIG. 15 shows the IV curve of a prior art design over temperature, of Icc and Vcc of RF transistor.

FIG. 15 shows how the IV curve of a prior art design varies over temperature. Because the prior art design has no or poor temperature compensation, the current at a given Vcc level is much higher in a hot environment than it is in a cold environment. This variation in current versus temperature is undesirable, and means that the LPA performance will vary significantly as the temperature changes. The plot also shows how the current increases with Vcc at a given temperature (shown in FIG. 11).

Figure 16:
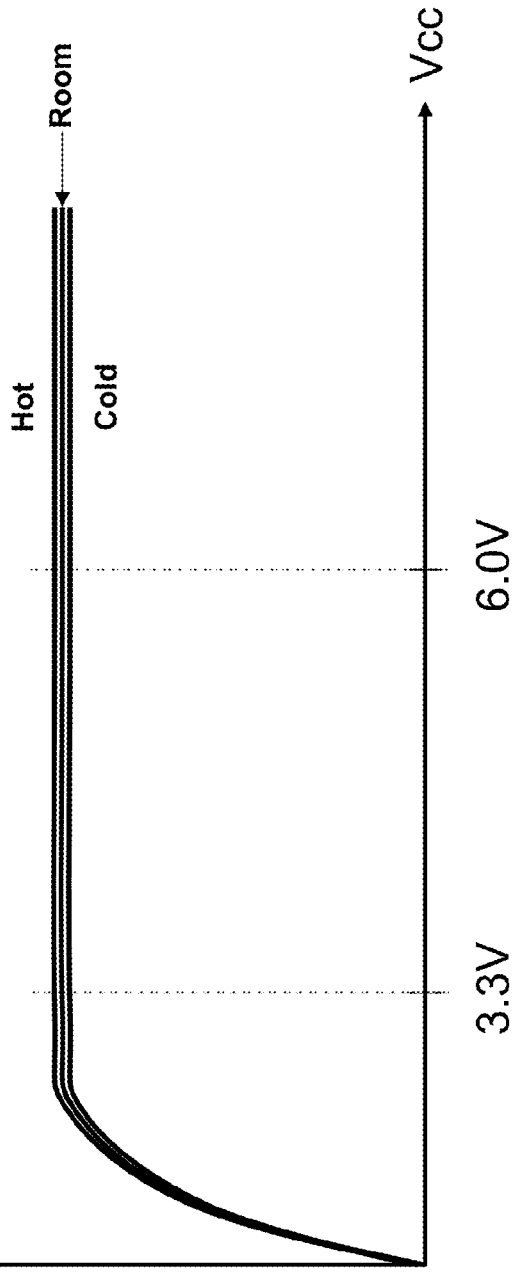
FIG. 16 shows the IV curve of the novel design over temperature

FIG. 16 shows the IV curve of the novel design over temperature, of Icc and Vcc of RF transistor.

FIG. 16 contrasts with FIG. 15, and it shows how the IV curve of the novel design varies over temperature. In FIG. 16, there is very little variation in current as the temperature varies, and current is also very flat as Vcc varies. This means that the LPA will have consistent performance over both temperature and supply voltage, which is a desirable characteristic for an amplifier.

Figure 17:
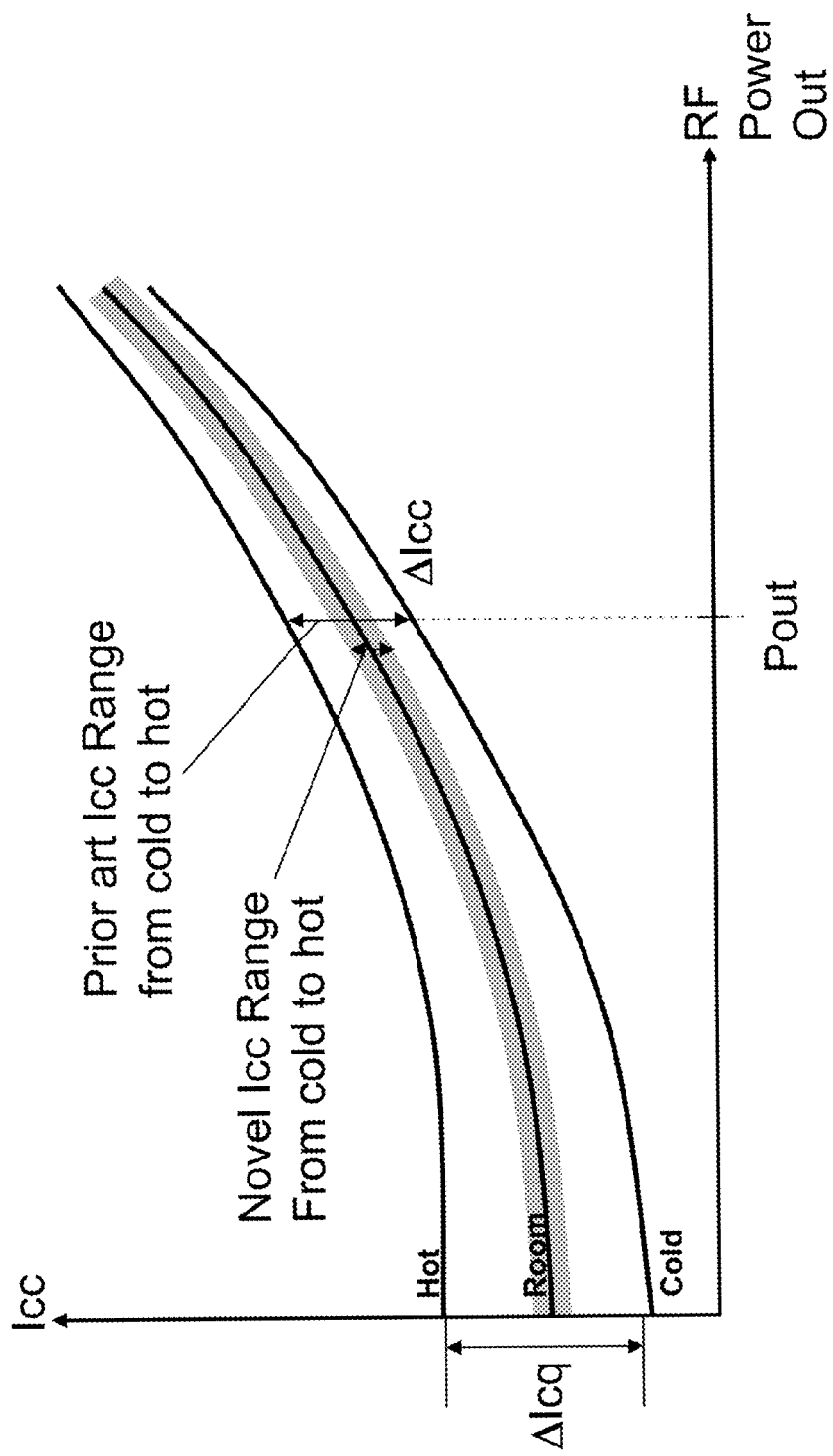
FIG. 17 shows the current variation vs RF power as the temperature varies from cold to hot for both a prior art design and for the novel design.

FIG. 17 shows the current variation, of Icc of RF transistor vs RF power as the temperature varies from cold to hot for both a prior art design and for the novel design.

In an LPA, it is desirable to minimize the variation in Icc and Icq (no RF) as temperature changes. In FIG. 17, for a prior art design the current levels vs. RF power are represented by the lines at cold, room, and hot temperatures respectively. For the novel design, the grey zone represents the current variation of the novel design over the same temperature range. At no/low RF power levels, the variation in quiescent current (delta Icq) of the prior art is large as temperature varies from cold to hot. In contrast, the novel design has much less variation over temperature. As the RF power increases, the amount of variation decreases for both the prior art and the novel designs, but the novel design always has much less variation over temperature than the prior art due to its improved temperature compensation characteristics.

Figure 18:
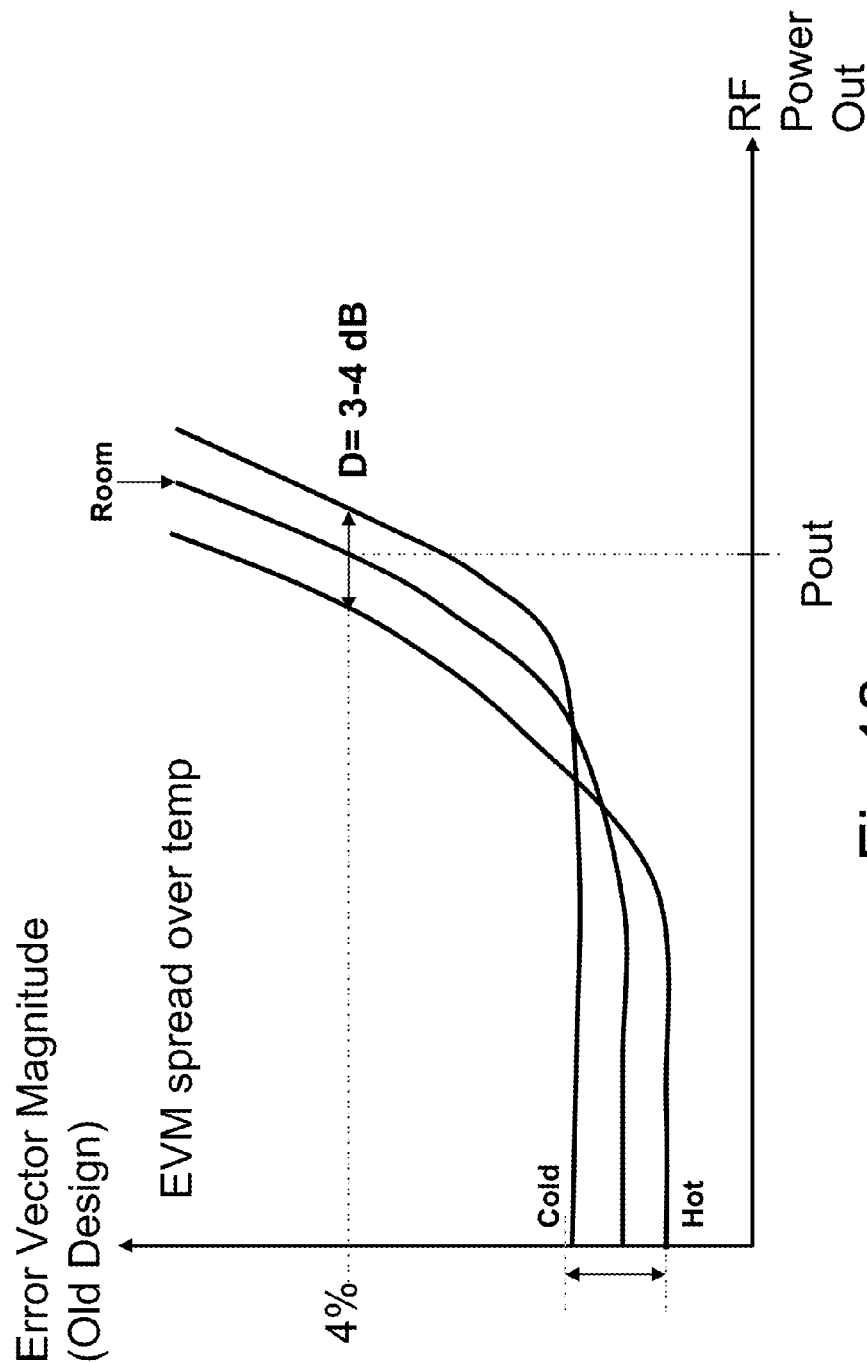
FIG. 18 shows the EVM curve vs RF power of a prior art design over temperature

FIG. 18 shows the EVM curve vs RF power of a prior art design over temperature

FIG. 18 shows how the EVM curve vs. RF power of a prior art design varies over temperature. Because the prior art design has no or poor temperature compensation, the EVM at a given RF power level is different in a hot environment than it is in a cold environment. At low RF power levels the EVM is higher when it is cold (due to lower Icq), but past a certain threshold where the EVM starts to rise rapidly. At fixed RF power level, the EVM is higher when it is hot (due to thermal effect). This variation in EVM versus temperature is undesirable, and means that the LPA performance will vary significantly as the temperature changes. The plot also shows that the power at which 4% EVM occurs may vary by 3-4 dB as the temperature changes from cold to hot.

Figure 19:
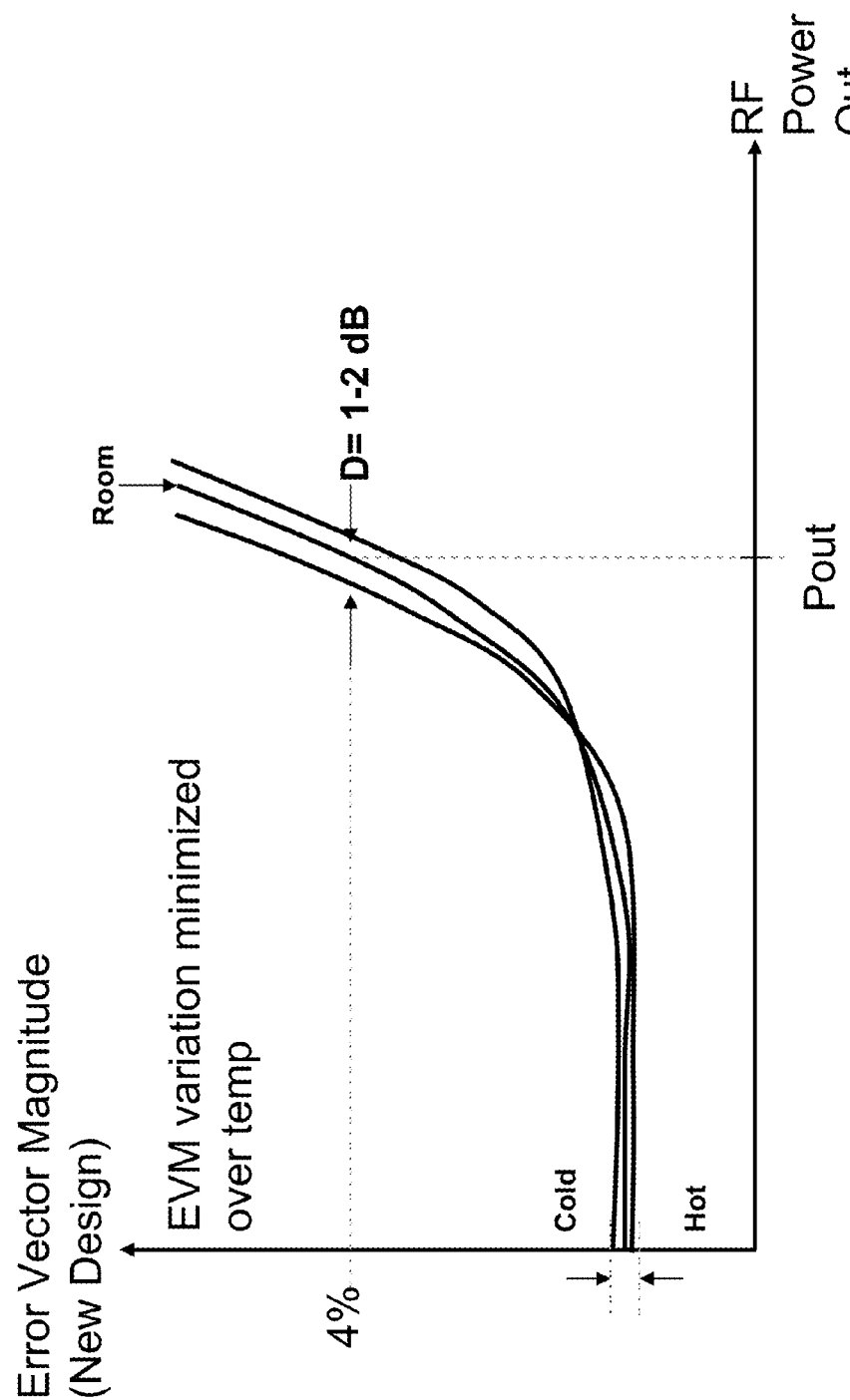
FIG. 19 shows the EVM curve vs RF power of the novel design over temperature

FIG. 19 shows the EVM curve vs RF power of the novel design over temperature

FIG. 19 shows how the EVM curve vs. RF power of the novel design varies over temperature, and this performance should be contrasted against FIG. 18. Because the novel design has good temperature compensation, EVM variation due to temperature at a given RF power level is much smaller than it is in the prior art design. At low RF power levels the EVM is only slightly higher when it is cold. There is still a threshold where the curves cross over, but this is due to the physics of the amplifier. The plot also shows that the power at which 4% EVM occurs may vary by only 1-2 dB as the temperature changes from cold to hot (instead of 3-4 dB as in the prior art).

Figure 20:
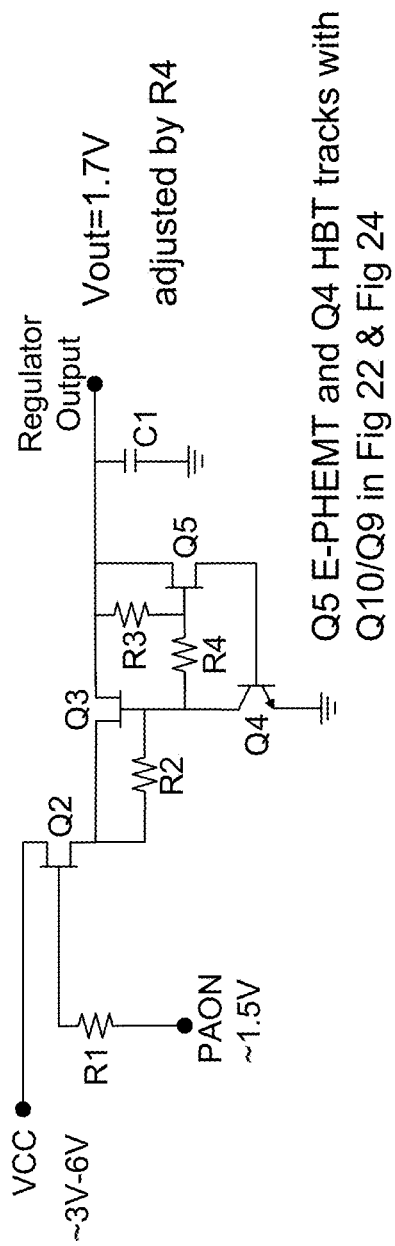
FIG. 20 shows a schematic of the novel regulator circuit with inputs (Vcc and PAON) and output (Vout) using an E-PHEMT as Q5.

FIG. 20 shows a schematic of the novel regulator circuit with inputs (Vcc and PAON) and output (Vout) using an E-PHEMT as Q5.

FIG. 20 shows a possible variation of the schematic in FIG. 2 where Q5 is an E-PHEMT instead of an HBT. In the FIG. 20 schematic the value of resistor R4 can be used to adjust the regulator output voltage. This particular schematic uses a E-PHEMT for Q5, and would be used with an E-Linearizer circuit where Q10 is also an E-PHEMT. The regulator output voltage would be 1.7V (=HBT turn-on voltage+E-PHEMT turn-on voltage=1.3+0.4). In this case the RF transistor would still be an HBT.

As mentioned in the description of FIG. 2, an additional variation could use E-PHEMTs for both Q4 and Q5. This would result in an output voltage of 0.8V (=2×E-PHEMT turn-on voltage=2×0.4V). This type of regulator would be useful if the RF transistors in the amplifiers were E-PHEMTs instead of HBT's.

Figure 21:
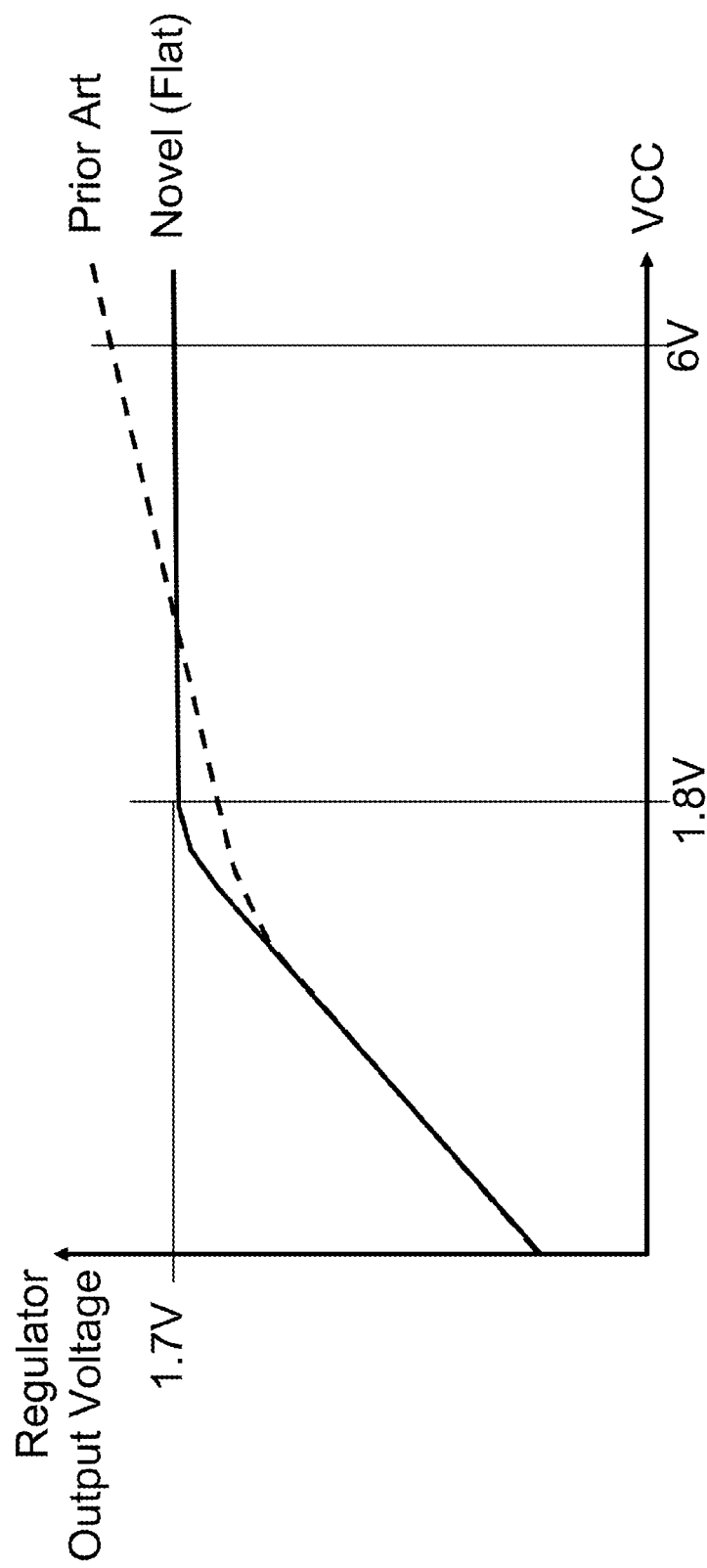
FIG. 21 shows output voltage of the novel regulator shown in FIG. 20 (use E-PHEMT for Q5) compared to a prior art regulator at a fixed RF power level.

FIG. 21 shows output voltage of the novel regulator shown in FIG. 20 (use E-PHEMT for Q5) compared to a prior art regulator at a fixed RF power level.

FIG. 21 shows that the output voltage of the novel regulator has a flatter output voltage level (1.7V) as Vcc varies compared to prior art regulators. A prior art regulator (consisting of a diode pair for example) increases slightly as Vcc increases, while the novel regulator output voltage remains essentially flat as Vcc changes. This will provide a more stable reference and supply voltage level for the dynamic bias circuit, thus improving overall LPA performance as Vcc varies.

Figure 22:
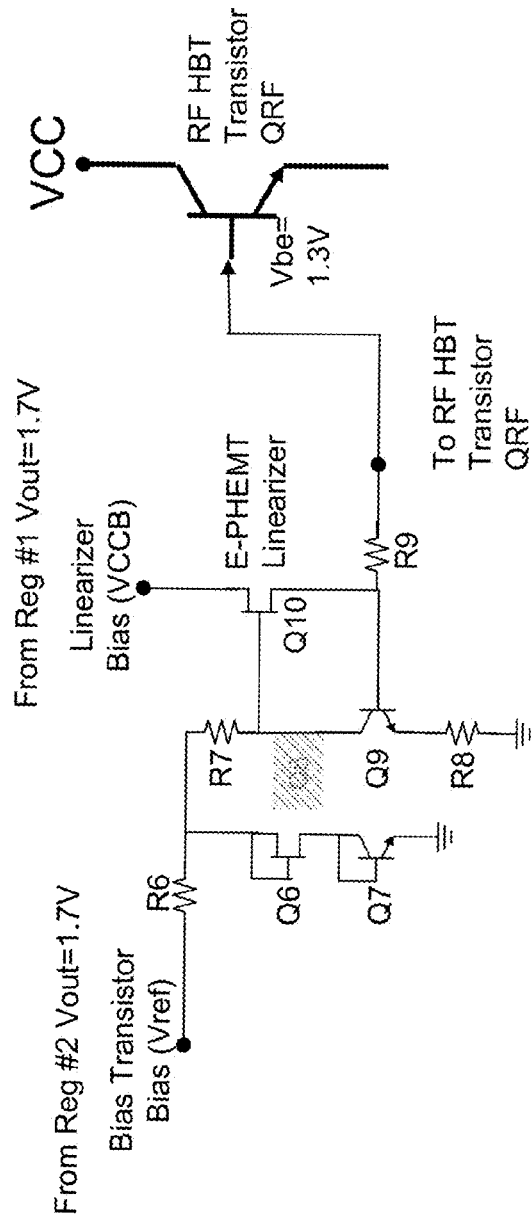
FIG. 22 shows a schematic of the novel dynamic bias circuit that uses an E-PHEMT as the linearizer (aka E-Linearizer).

FIG. 22 shows a schematic of the novel dynamic bias circuit that uses an E-PHEMT as the linearizer.

FIG. 22 shows a variation of the dynamic bias circuit similar to the schematic in FIG. 3, but using an E-PHEMT as the linearizer transistor Q10. In this case the temperature compensation diode Q8 is optional, since the combined temperature response of the E-PHEMT Q10 and the RF HBT is good. This circuit works with the regulator schematic shown in FIG. 20. The type of transistor used as the linearizer (Q10) matches the type of transistor used for Q5 in the regulator, and the type of transistor used as the bias transistor (Q9) matches the type of the transistor used for Q4 in the regulator.

Figure 23:
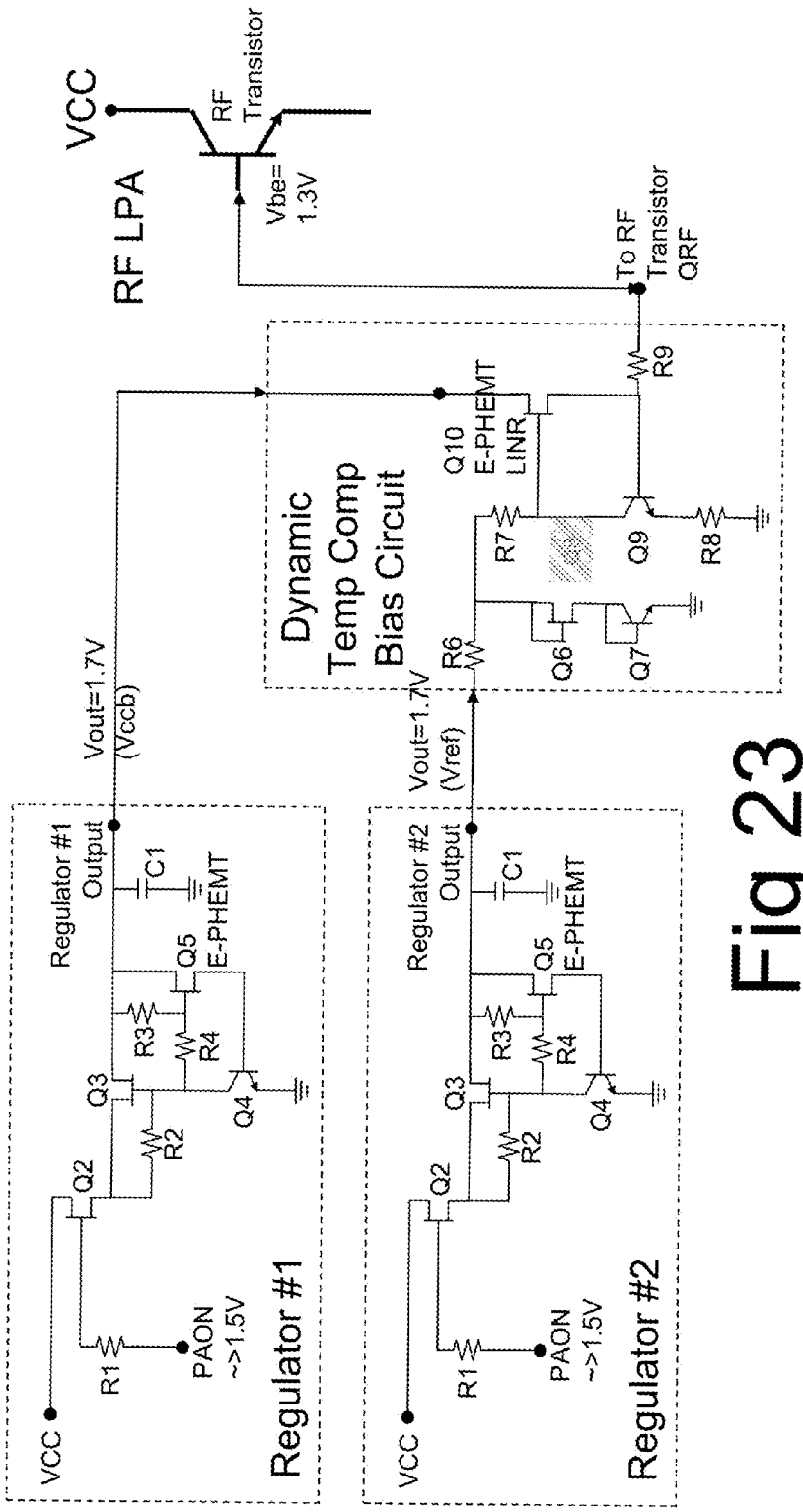
FIG. 23 shows an overall schematic of 2 novel regulators (E-PHEMT for Q5), a dynamic temp-comp bias circuit (E-linearizer for Q10), and an RF transistor.

FIG. 23 shows an overall schematic of 2 novel regulators (E-PHEMT for Q5), a dynamic temp-comp bias circuit (linearizer for Q10), and an RF transistor.

Figure 24:
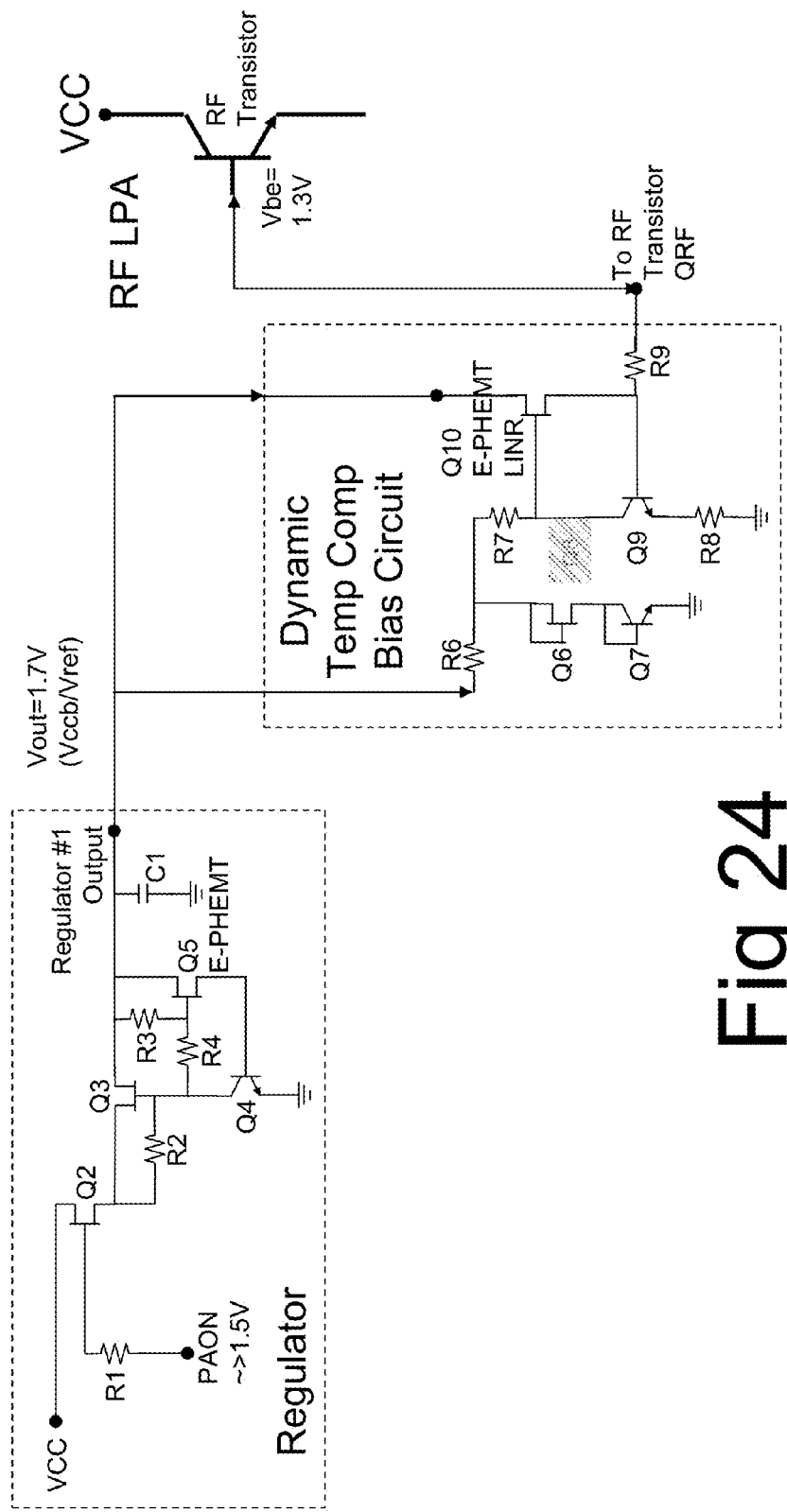
FIG. 24 shows an overall schematic of 1 novel regulator (E-PHEMT for Q5), a dynamic temp-comp bias circuit (E-linearizer for Q10), and an RF transistor.

FIG. 23 shows a detailed schematic for the block diagram in FIG. 1, by combining the circuits shown in FIG. 20 and FIG. 22. The variations described in those figures also apply to FIG. 23. This FIG. 23 schematic can be compared to the schematic in FIG. 4. In FIG. 23, Q5 (in regulators #1 and #2) should be the same type of transistor as Q10—in this case they are E-PHEMT. Q4 (in regulators #1 and #2), Q9, and the RF transistor should also all be the same type of transistor—either HBT or E-PHEMT. The regulator output voltages and the bias circuit output voltage will vary with the type of transistors used. An additional variation could use a single regulator for both Vccb and Vref, as shown in FIG. 24.

Depending on the types of transistors used, the regulator output voltages may be:
2.6V (if Q4, Q5, Q9, Q10, and RF transistor are all HBTs). Vbe will be 1.3V.
1.7V (if Q5 and Q10 are E-PHEMTs, and Q4, Q9, and the RF transistor are HBTs). Vbe will be 1.3V.
0.8V (if Q4, Q5, Q9, Q10, and RF transistor are all E-PHEMTs). Vbe [actually Vgs for E-PHEMT] will be 0.4V.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A temperature compensated bias circuit of a radio frequency transistor having a control terminal, a first current carrying terminal, and a second current carrying terminal, comprising:
    an output providing a temperature compensated bias to a radio frequency transistor;
    a first transistor having a control terminal, a first current carrying terminal receiving power from a first regulated voltage source, and a second current carrying terminal coupled to the output;

a second transistor having a control terminal coupled to the second current carrying terminal of the first transistor and the output, a first current carrying terminal receiving power from a second regulated voltage source, and a second current carrying terminal coupled to a ground; and a diode at an intermediate position between the second regulated voltage source and the first current carrying terminal of the second transistor, the diode determining current through the first current carrying terminal of the second transistor, and the current through the first current carrying terminal of the second transistor determines a first voltage difference between the control terminal of the second transistor and the second current carrying terminal of the second transistor.

2. The circuit of claim 1, wherein at least one of the first transistor and the second transistor is a bipolar junction transistor, such that the control terminal of the bipolar junction transistor is a base terminal, the first current carrying terminal of the bipolar junction transistor is a collector terminal, and the second current carrying terminal of the bipolar junction transistor is an emitter terminal.

3. The circuit of claim 1, wherein at least one of the first transistor and the second transistor is an enhancement mode pseudomorphic high electron mobility transistor, and the control terminal of the enhancement mode pseudomorphic high electron mobility transistor is a gate terminal, the first current carrying terminal of the enhancement mode pseudomorphic high electron mobility transistor is a drain terminal, and the second current carrying terminal of the enhancement mode pseudomorphic high electron mobility transistor is a source terminal.

4. The circuit of claim 1, wherein the first voltage difference determines a second voltage difference between a control terminal of the radio frequency transistor and the second current carrying terminal of the radio frequency transistor.

5. The circuit of claim 1, wherein responsive to temperature variation, the current through the first current carrying terminal of the second transistor determined by the diode, but the first voltage difference of the second transistor changes with temperature variation.

6. The circuit of claim 1, wherein responsive to temperature variation, the current through the first current carrying terminal of the second transistor determined by the diode, but the first voltage difference of the second transistor changes with temperature variation, such that the first voltage difference determines a temperature compensated voltage difference between a control terminal of the radio frequency transistor and the second current carrying terminal of the radio frequency transistor.

7. The circuit of claim 1, wherein the second transistor has a floating voltage of a difference between the first and second current carrying terminals.

8. The circuit of claim 1, wherein over a range of an output power of the radio frequency transistor, the first transistor has a current through the first current carrying terminal which increases with the output power of the radio frequency transistor, and the range of an output power of the radio frequency transistor includes an upper power range over a threshold power and a lower power range under the threshold power, such that a rate of increase of the current through the first current carrying terminal of the first transistor is less in the upper power range than in the lower power range, thereby at least partly compensating for nonlinearity of the radio frequency transistor in the upper power range.

* * * * *